(12) United States Patent
Hydrick et al.

(10) Patent No.: US 9,287,128 B2
(45) Date of Patent: Mar. 15, 2016

(54) POLISHING OF SMALL COMPOSITE SEMICONDUCTOR MATERIALS

(71) Applicant: Taiwan Semiconductor Manufacturing Company, Ltd., Hsin-Chu (TW)

(72) Inventors: Jennifer M. Hydrick, Kingston, NH (US); James Fiorenza, Wilmington, MA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/635,926

(22) Filed: Mar. 2, 2015

(65) Prior Publication Data

US 2015/0170930 A1   Jun. 18, 2015

Related U.S. Application Data

(62) Division of application No. 12/503,597, filed on Jul. 15, 2009, now Pat. No. 8,981,427.

(60) Provisional application No. 61/080,779, filed on Jul. 15, 2008.

(51) Int. Cl.
*H01L 21/302* (2006.01)
*H01L 21/306* (2006.01)
(Continued)

(52) U.S. Cl.
CPC .... *H01L 21/30625* (2013.01); *H01L 21/02057* (2013.01); *H01L 21/02065* (2013.01);
(Continued)

(58) Field of Classification Search
CPC ................................................ H01L 21/02381

USPC ......... 438/22, 29, 42, 44, 222, 226, 241, 481, 438/483, 479, 493, 626, 692; 257/77, 103, 257/190, 194, 613, 615, 616, 752, E27.095, 257/E21.09, E29.002, E33.005, E21.125, 257/E29.193, E21.23, E21.305
See application file for complete search history.

(56) References Cited

U.S. PATENT DOCUMENTS

| 4,307,510 A | 12/1981 | Sawyer et al. |
| 4,322,253 A | 3/1982 | Pankove et al. |

(Continued)

FOREIGN PATENT DOCUMENTS

| CN | 2550906 | 5/2003 |
| DE | 10017137 | 10/2000 |

(Continued)

OTHER PUBLICATIONS

Kwok K. Ng, "Resonant-Tunneling Diode," Complete Guide to Semiconductor Devices, Chapter 10. Nov. 3, 2010, pp. 75-83.

(Continued)

*Primary Examiner* — Yosef Gebreyesus
(74) *Attorney, Agent, or Firm* — Slater & Matsil, L.L.P.

(57) ABSTRACT

A device includes a crystalline material within an area confined by an insulator. A surface of the crystalline material has a reduced roughness. One example includes obtaining a surface with reduced roughness by using a planarization process configured with a selectivity of the crystalline material to the insulator greater than one. In a preferred embodiment, the planarization process uses a composition including abrasive spherical silica, $H_2O_2$ and water. In a preferred embodiment, the area confined by the insulator is an opening in the insulator having an aspect ratio sufficient to trap defects using an ART technique.

20 Claims, 17 Drawing Sheets

(51) Int. Cl.
  *H01L 21/02* (2006.01)
  *H01L 21/3105* (2006.01)
  *H01L 21/28* (2006.01)

(52) U.S. Cl.
  CPC .... *H01L21/02381* (2013.01); *H01L 21/02532* (2013.01); *H01L 21/30604* (2013.01); *H01L 21/31055* (2013.01); H01L 21/28255 (2013.01); H01L 21/28264 (2013.01)

(56) References Cited

U.S. PATENT DOCUMENTS

| | | | |
|---|---|---|---|
| 4,370,510 A | 1/1983 | Stirn | |
| 4,545,109 A | 10/1985 | Reichert | |
| 4,551,394 A | 11/1985 | Betsch et al. | |
| 4,651,179 A | 3/1987 | Reichert | |
| 4,727,047 A | 2/1988 | Bozler et al. | |
| 4,774,205 A | 9/1988 | Choi et al. | |
| 4,789,643 A | 12/1988 | Kajikawa | |
| 4,826,784 A | 5/1989 | Salerno et al. | |
| 4,860,081 A | 8/1989 | Cogan | |
| 4,876,210 A | 10/1989 | Barnett et al. | |
| 4,948,456 A | 8/1990 | Schubert | |
| 4,963,508 A | 10/1990 | Umeno et al. | |
| 5,032,893 A | 7/1991 | Fitzgerald, Jr. et al. | |
| 5,034,337 A | 7/1991 | Mosher et al. | |
| 5,061,644 A | 10/1991 | Yue et al. | |
| 5,079,616 A | 1/1992 | Yacobi et al. | |
| 5,091,333 A | 2/1992 | Fan et al. | |
| 5,091,767 A | 2/1992 | Bean et al. | |
| 5,093,699 A | 3/1992 | Weichold et al. | |
| 5,098,850 A | 3/1992 | Nishida et al. | |
| 5,105,247 A | 4/1992 | Cavanaugh | |
| 5,108,947 A | 4/1992 | Demeester et al. | |
| 5,156,995 A | 10/1992 | Fitzgerald, Jr. et al. | |
| 5,159,413 A | 10/1992 | Calviello et al. | |
| 5,164,359 A | 11/1992 | Calviello et al. | |
| 5,166,767 A | 11/1992 | Kapoor et al. | |
| 5,223,043 A | 6/1993 | Olson et al. | |
| 5,236,546 A | 8/1993 | Mizutani | |
| 5,238,869 A | 8/1993 | Shichijo et al. | |
| 5,256,594 A | 10/1993 | Wu et al. | |
| 5,269,852 A | 12/1993 | Nishida | |
| 5,269,876 A | 12/1993 | Mizutani | |
| 5,272,105 A | 12/1993 | Yacobi et al. | |
| 5,281,283 A | 1/1994 | Tokunaga et al. | |
| 5,285,086 A | 2/1994 | Fitzgerald, Jr. | |
| 5,295,150 A | 3/1994 | Vangieson et al. | |
| 5,356,831 A | 10/1994 | Calviello et al. | |
| 5,403,751 A | 4/1995 | Nishida et al. | |
| 5,405,453 A | 4/1995 | Ho et al. | |
| 5,407,491 A | 4/1995 | Freundlich et al. | |
| 5,410,167 A | 4/1995 | Saito | |
| 5,417,180 A | 5/1995 | Nakamura | |
| 5,427,976 A | 6/1995 | Koh et al. | |
| 5,432,120 A | 7/1995 | Meister et al. | |
| 5,438,018 A | 8/1995 | Mori et al. | |
| 5,461,243 A | 10/1995 | Ek et al. | |
| 5,516,716 A * | 5/1996 | Hawkins | H01L 29/66954 257/248 |
| 5,518,953 A | 5/1996 | Takasu | |
| 5,528,209 A | 6/1996 | MacDonald et al. | |
| 5,545,586 A | 8/1996 | Koh | |
| 5,548,129 A | 8/1996 | Kubena | |
| 5,589,696 A | 12/1996 | Baba | |
| 5,621,227 A | 4/1997 | Joshi | |
| 5,622,891 A | 4/1997 | Saito | |
| 5,640,022 A | 6/1997 | Inai | |
| 5,710,436 A | 1/1998 | Tanamoto et al. | |
| 5,717,709 A | 2/1998 | Sasaki et al. | |
| 5,792,679 A | 8/1998 | Nakato | |
| 5,825,049 A | 10/1998 | Simmons et al. | |
| 5,825,240 A | 10/1998 | Geis et al. | |
| 5,849,077 A | 12/1998 | Kenney | |
| 5,853,497 A | 12/1998 | Lillington et al. | |
| 5,869,845 A | 2/1999 | Vander Wagt et al. | |
| 5,883,549 A | 3/1999 | De Los Santos | |
| 5,886,385 A | 3/1999 | Arisumi et al. | |
| 5,903,170 A | 5/1999 | Kulkarni et al. | |
| 5,953,361 A | 9/1999 | Borchert et al. | |
| 5,959,308 A | 9/1999 | Shichijo et al. | |
| 5,966,620 A | 10/1999 | Sakaguchi et al. | |
| 5,998,781 A | 12/1999 | Vawter et al. | |
| 6,011,271 A | 1/2000 | Sakuma et al. | |
| 6,015,979 A | 1/2000 | Sugiura et al. | |
| 6,049,098 A | 4/2000 | Sato | |
| 6,083,598 A | 7/2000 | Ohkubo et al. | |
| 6,100,106 A | 8/2000 | Yamaguchi et al. | |
| 6,110,813 A | 8/2000 | Ota et al. | |
| 6,111,288 A | 8/2000 | Watanabe et al. | |
| 6,121,542 A | 9/2000 | Shiotsuka et al. | |
| 6,150,242 A | 11/2000 | Van de Wagt et al. | |
| 6,153,010 A | 11/2000 | Kiyoku et al. | |
| 6,191,432 B1 | 2/2001 | Sugiyama et al. | |
| 6,225,650 B1 | 5/2001 | Tadatomo et al. | |
| 6,228,691 B1 | 5/2001 | Doyle | |
| 6,229,153 B1 | 5/2001 | Botez et al. | |
| 6,235,547 B1 | 5/2001 | Sakuma et al. | |
| 6,252,261 B1 | 6/2001 | Usui et al. | |
| 6,252,287 B1 | 6/2001 | Kurtz et al. | |
| 6,271,551 B1 | 8/2001 | Schmitz et al. | |
| 6,274,889 B1 | 8/2001 | Ota et al. | |
| 6,300,650 B1 | 10/2001 | Sato | |
| 6,320,220 B1 | 11/2001 | Watanabe et al. | |
| 6,325,850 B1 | 12/2001 | Beaumont et al. | |
| 6,339,232 B1 | 1/2002 | Takagi | |
| 6,342,404 B1 | 1/2002 | Shibata et al. | |
| 6,342,733 B1 * | 1/2002 | Hu | H01L 21/288 257/750 |
| 6,348,096 B1 | 2/2002 | Sunakawa et al. | |
| 6,352,942 B1 | 3/2002 | Luan et al. | |
| 6,362,071 B1 | 3/2002 | Nguyen et al. | |
| 6,380,051 B1 | 4/2002 | Yuasa et al. | |
| 6,380,590 B1 | 4/2002 | Yu | |
| 6,403,451 B1 | 6/2002 | Linthicum et al. | |
| 6,407,425 B1 | 6/2002 | Babcock et al. | |
| 6,456,214 B1 | 9/2002 | van der Wagt | |
| 6,458,614 B1 | 10/2002 | Nanishi et al. | |
| 6,475,869 B1 | 11/2002 | Yu | |
| 6,492,216 B1 | 12/2002 | Yeo et al. | |
| 6,492,260 B1 * | 12/2002 | Kim | H01L 21/7684 257/E21.583 |
| 6,500,257 B1 | 12/2002 | Wang et al. | |
| 6,503,610 B2 | 1/2003 | Hiramatsu et al. | |
| 6,512,252 B1 | 1/2003 | Takagi et al. | |
| 6,521,514 B1 | 2/2003 | Gehrke et al. | |
| 6,552,259 B1 | 4/2003 | Hosomi et al. | |
| 6,566,284 B2 | 5/2003 | Thomas, III et al. | |
| 6,576,532 B1 | 6/2003 | Jones et al. | |
| 6,579,463 B1 | 6/2003 | Winningham et al. | |
| 6,603,172 B1 | 8/2003 | Segawa et al. | |
| 6,606,335 B1 | 8/2003 | Kuramata et al. | |
| 6,617,643 B1 | 9/2003 | Goodwin-Johansson | |
| 6,635,110 B1 | 10/2003 | Luan et al. | |
| 6,645,295 B1 | 11/2003 | Koike et al. | |
| 6,645,797 B1 | 11/2003 | Buynoski et al. | |
| 6,686,245 B1 | 2/2004 | Mathew et al. | |
| 6,703,253 B2 | 3/2004 | Koide | |
| 6,709,982 B1 | 3/2004 | Buynoski et al. | |
| 6,710,368 B2 | 3/2004 | Fisher et al. | |
| 6,720,196 B2 | 4/2004 | Kunisato et al. | |
| 6,727,523 B2 | 4/2004 | Morita | |
| 6,753,555 B2 | 6/2004 | Takagi et al. | |
| 6,756,611 B2 | 6/2004 | Kiyoku et al. | |
| 6,762,483 B1 | 7/2004 | Krivokapic et al. | |
| 6,767,793 B2 | 7/2004 | Clark et al. | |
| 6,784,074 B2 | 8/2004 | Shchukin et al. | |
| 6,787,864 B2 | 9/2004 | Paton et al. | |
| 6,794,718 B2 | 9/2004 | Nowak et al. | |
| 6,800,910 B2 | 10/2004 | Lin et al. | |
| 6,803,598 B1 | 10/2004 | Berger et al. | |
| 6,809,351 B2 | 10/2004 | Kuramoto et al. | |
| 6,812,053 B1 | 11/2004 | Kong et al. | |
| 6,812,495 B2 | 11/2004 | Wada et al. | |

(56) References Cited

U.S. PATENT DOCUMENTS

| | | | |
|---|---|---|---|
| 6,815,241 B2 | 11/2004 | Wang | |
| 6,815,738 B2 | 11/2004 | Rim | |
| 6,825,534 B2 | 11/2004 | Chen et al. | |
| 6,831,350 B1 | 12/2004 | Liu et al. | |
| 6,835,246 B2 | 12/2004 | Zaidi | |
| 6,835,618 B1 | 12/2004 | Dakshina-Murthy et al. | |
| 6,838,322 B2 | 1/2005 | Pham et al. | |
| 6,838,355 B1* | 1/2005 | Stamper | H01L 21/76801 257/E21.576 |
| 6,841,410 B2 | 1/2005 | Sasaoka | |
| 6,841,808 B2 | 1/2005 | Shibata et al. | |
| 6,849,077 B2 | 2/2005 | Ricci | |
| 6,849,487 B2 | 2/2005 | Taylor, Jr. et al. | |
| 6,849,884 B2 | 2/2005 | Clark et al. | |
| 6,855,583 B1 | 2/2005 | Krivokapic et al. | |
| 6,855,982 B1 | 2/2005 | Xiang et al. | |
| 6,855,990 B2 | 2/2005 | Hu et al. | |
| 6,867,433 B2 | 3/2005 | Yeo et al. | |
| 6,873,009 B2 | 3/2005 | Hisamoto et al. | |
| 6,882,051 B2 | 4/2005 | Majumdar et al. | |
| 6,887,773 B2 | 5/2005 | Gunn, III et al. | |
| 6,888,181 B1 | 5/2005 | Liao et al. | |
| 6,900,070 B2 | 5/2005 | Craven et al. | |
| 6,900,502 B2 | 5/2005 | Ge et al. | |
| 6,902,965 B2 | 6/2005 | Ge et al. | |
| 6,902,991 B2 | 6/2005 | Xiang et al. | |
| 6,909,186 B2 | 6/2005 | Chu | |
| 6,917,068 B1 | 7/2005 | Krivokapic | |
| 6,919,258 B2 | 7/2005 | Grant et al. | |
| 6,920,159 B2 | 7/2005 | Sidorin et al. | |
| 6,921,673 B2 | 7/2005 | Kobayashi et al. | |
| 6,921,963 B2 | 7/2005 | Krivokapic et al. | |
| 6,921,982 B2 | 7/2005 | Joshi et al. | |
| 6,936,875 B2 | 8/2005 | Sugii et al. | |
| 6,943,407 B2 | 9/2005 | Ouyang et al. | |
| 6,946,683 B2 | 9/2005 | Sano et al. | |
| 6,949,769 B2 | 9/2005 | Hu et al. | |
| 6,951,819 B2 | 10/2005 | Iles et al. | |
| 6,955,969 B2 | 10/2005 | Djomehri et al. | |
| 6,955,977 B2 | 10/2005 | Kong et al. | |
| 6,958,254 B2 | 10/2005 | Seifert | |
| 6,960,781 B2 | 11/2005 | Currie et al. | |
| 6,974,733 B2 | 12/2005 | Boyanov et al. | |
| 6,977,194 B2 | 12/2005 | Belyansky et al. | |
| 6,982,204 B2 | 1/2006 | Saxler et al. | |
| 6,982,435 B2 | 1/2006 | Shibata et al. | |
| 6,984,571 B1 | 1/2006 | Enquist | |
| 6,991,998 B2 | 1/2006 | Bedell et al. | |
| 6,994,751 B2 | 2/2006 | Hata et al. | |
| 6,995,430 B2 | 2/2006 | Langdo et al. | |
| 6,995,456 B2 | 2/2006 | Nowak | |
| 6,996,147 B2 | 2/2006 | Majumdar et al. | |
| 6,998,684 B2 | 2/2006 | Anderson et al. | |
| 7,001,804 B2 | 2/2006 | Dietz et al. | |
| 7,002,175 B1 | 2/2006 | Singh et al. | |
| 7,012,298 B1 | 3/2006 | Krivokapic | |
| 7,012,314 B2 | 3/2006 | Bude et al. | |
| 7,015,497 B1 | 3/2006 | Berger | |
| 7,015,517 B2 | 3/2006 | Grant et al. | |
| 7,033,436 B2 | 4/2006 | Biwa et al. | |
| 7,033,936 B1 | 4/2006 | Green | |
| 7,041,178 B2 | 5/2006 | Tong et al. | |
| 7,045,401 B2 | 5/2006 | Lee et al. | |
| 7,049,627 B2 | 5/2006 | Vineis et al. | |
| 7,061,065 B2 | 6/2006 | Horng et al. | |
| 7,074,623 B2 | 7/2006 | Lochtefeld et al. | |
| 7,078,299 B2 | 7/2006 | Maszara et al. | |
| 7,078,731 B2* | 7/2006 | D'Evelyn | B82Y 10/00 257/103 |
| 7,084,051 B2 | 8/2006 | Ueda | |
| 7,084,441 B2 | 8/2006 | Saxler | |
| 7,087,965 B2 | 8/2006 | Chan et al. | |
| 7,088,143 B2 | 8/2006 | Ding et al. | |
| 7,091,561 B2 | 8/2006 | Matsushita et al. | |
| 7,095,043 B2 | 8/2006 | Oda et al. | |
| 7,098,508 B2 | 8/2006 | Ieong et al. | |
| 7,101,444 B2 | 9/2006 | Shchukin et al. | |
| 7,109,516 B2 | 9/2006 | Langdo et al. | |
| 7,118,987 B2 | 10/2006 | Fu et al. | |
| 7,119,402 B2 | 10/2006 | Kinoshita et al. | |
| 7,122,733 B2 | 10/2006 | Narayanan et al. | |
| 7,125,785 B2 | 10/2006 | Cohen et al. | |
| 7,128,846 B2 | 10/2006 | Nishijima et al. | |
| 7,132,691 B1 | 11/2006 | Tanabe et al. | |
| 7,138,292 B2 | 11/2006 | Mirabedini et al. | |
| 7,138,302 B2 | 11/2006 | Xiang et al. | |
| 7,145,167 B1 | 12/2006 | Chu | |
| 7,154,118 B2 | 12/2006 | Lindert et al. | |
| 7,160,753 B2 | 1/2007 | Williams, Jr. | |
| 7,164,183 B2 | 1/2007 | Sakaguchi et al. | |
| 7,176,522 B2 | 2/2007 | Cheng et al. | |
| 7,179,727 B2 | 2/2007 | Capewell et al. | |
| 7,180,134 B2 | 2/2007 | Yang et al. | |
| 7,195,993 B2 | 3/2007 | Zheleva et al. | |
| 7,198,995 B2 | 4/2007 | Chidambarrao et al. | |
| 7,205,586 B2 | 4/2007 | Takagi et al. | |
| 7,205,604 B2 | 4/2007 | Ouyang et al. | |
| 7,211,864 B2 | 5/2007 | Seliskar | |
| 7,217,882 B2 | 5/2007 | Walukiewicz et al. | |
| 7,224,033 B2 | 5/2007 | Zhu et al. | |
| 7,244,958 B2 | 7/2007 | Shang et al. | |
| 7,247,534 B2 | 7/2007 | Chidambarrao et al. | |
| 7,247,912 B2 | 7/2007 | Zhu et al. | |
| 7,250,359 B2 | 7/2007 | Fitzgerald | |
| 7,262,117 B1 | 8/2007 | Gunn, III et al. | |
| 7,268,058 B2 | 9/2007 | Chau et al. | |
| 7,297,569 B2 | 11/2007 | Bude et al. | |
| 7,344,942 B2 | 3/2008 | Korber | |
| 7,361,576 B2 | 4/2008 | Imer et al. | |
| 7,372,066 B2 | 5/2008 | Sato et al. | |
| 7,420,201 B2 | 9/2008 | Langdo et al. | |
| 7,449,379 B2 | 11/2008 | Ochimizu et al. | |
| 7,582,498 B2 | 9/2009 | D'Evelyn et al. | |
| 7,626,246 B2* | 12/2009 | Lochtefeld | H01L 21/823807 257/510 |
| 7,638,842 B2 | 12/2009 | Currie et al. | |
| 7,655,960 B2 | 2/2010 | Nakahata et al. | |
| 7,678,625 B2 | 3/2010 | Lim et al. | |
| 7,777,250 B2 | 8/2010 | Lochtefeld | |
| 7,786,503 B2* | 8/2010 | D'Evelyn | C30B 9/00 257/103 |
| 7,799,592 B2 | 9/2010 | Lochtefeld | |
| 7,825,328 B2 | 11/2010 | Li | |
| 7,875,958 B2 | 1/2011 | Cheng et al. | |
| 8,034,696 B2* | 10/2011 | Tsuchiya | C30B 23/00 257/E21.09 |
| 8,034,697 B2 | 10/2011 | Fiorenza et al. | |
| 8,187,377 B2 | 5/2012 | Malik et al. | |
| 8,502,263 B2* | 8/2013 | Li | H01L 21/02381 257/103 |
| 2001/0006249 A1 | 7/2001 | Fitzgerald | |
| 2001/0045604 A1 | 11/2001 | Oda et al. | |
| 2002/0011612 A1 | 1/2002 | Hieda | |
| 2002/0017642 A1 | 2/2002 | Mizushima et al. | |
| 2002/0022290 A1 | 2/2002 | Kong et al. | |
| 2002/0030246 A1 | 3/2002 | Eisenbeiser et al. | |
| 2002/0036290 A1 | 3/2002 | Inaba et al. | |
| 2002/0039839 A1* | 4/2002 | Thomas | C09G 1/02 438/693 |
| 2002/0046693 A1 | 4/2002 | Kiyoku et al. | |
| 2002/0047155 A1 | 4/2002 | Babcock et al. | |
| 2002/0066403 A1 | 6/2002 | Sunakawa et al. | |
| 2002/0070383 A1 | 6/2002 | Shibata et al. | |
| 2002/0084000 A1 | 7/2002 | Fitzgerald | |
| 2002/0127427 A1 | 9/2002 | Young et al. | |
| 2002/0168802 A1 | 11/2002 | Hsu et al. | |
| 2002/0168844 A1 | 11/2002 | Kuramoto et al. | |
| 2002/0179005 A1 | 12/2002 | Koike et al. | |
| 2003/0030117 A1 | 2/2003 | Iwasaki et al. | |
| 2003/0045017 A1 | 3/2003 | Hiramatsu et al. | |
| 2003/0057486 A1 | 3/2003 | Gambino et al. | |
| 2003/0064535 A1 | 4/2003 | Kub et al. | |
| 2003/0070707 A1 | 4/2003 | King et al. | |
| 2003/0087462 A1 | 5/2003 | Koide et al. | |

(56) References Cited

U.S. PATENT DOCUMENTS

| | | |
|---|---|---|
| 2003/0089899 A1 | 5/2003 | Lieber et al. |
| 2003/0155586 A1 | 8/2003 | Koide et al. |
| 2003/0157376 A1 | 8/2003 | Vaudo et al. |
| 2003/0168002 A1 | 9/2003 | Zaidi |
| 2003/0178677 A1 | 9/2003 | Clark et al. |
| 2003/0178681 A1 | 9/2003 | Clark et al. |
| 2003/0183827 A1 | 10/2003 | Kawaguchi et al. |
| 2003/0194879 A1* | 10/2003 | Small .................. C09G 1/02 438/753 |
| 2003/0203531 A1 | 10/2003 | Shchukin et al. |
| 2003/0207518 A1 | 11/2003 | Kong et al. |
| 2003/0227036 A1 | 12/2003 | Sugiyama et al. |
| 2003/0230759 A1 | 12/2003 | Thomas, III et al. |
| 2004/0005740 A1 | 1/2004 | Lochtefeld et al. |
| 2004/0012037 A1 | 1/2004 | Venkatesan et al. |
| 2004/0016921 A1 | 1/2004 | Botez et al. |
| 2004/0031979 A1 | 2/2004 | Lochtefeld et al. |
| 2004/0041932 A1 | 3/2004 | Chao et al. |
| 2004/0043584 A1 | 3/2004 | Thomas et al. |
| 2004/0072410 A1 | 4/2004 | Motoki et al. |
| 2004/0075105 A1 | 4/2004 | Leitz et al. |
| 2004/0075464 A1 | 4/2004 | Samuelson et al. |
| 2004/0082150 A1 | 4/2004 | Kong et al. |
| 2004/0087051 A1 | 5/2004 | Furuya et al. |
| 2004/0092060 A1 | 5/2004 | Gambino et al. |
| 2004/0092102 A1 | 5/2004 | Li et al. |
| 2004/0118451 A1 | 6/2004 | Walukiewicz et al. |
| 2004/0121507 A1 | 6/2004 | Bude et al. |
| 2004/0123796 A1 | 7/2004 | Nagai et al. |
| 2004/0142503 A1 | 7/2004 | Lee et al. |
| 2004/0150001 A1 | 8/2004 | Shchukin et al. |
| 2004/0155249 A1 | 8/2004 | Narui et al. |
| 2004/0173812 A1 | 9/2004 | Currie et al. |
| 2004/0183078 A1 | 9/2004 | Wang |
| 2004/0185665 A1 | 9/2004 | Kishimoto et al. |
| 2004/0188791 A1 | 9/2004 | Horng et al. |
| 2004/0195624 A1 | 10/2004 | Liu et al. |
| 2004/0214407 A1 | 10/2004 | Westhoff et al. |
| 2004/0227187 A1 | 11/2004 | Cheng et al. |
| 2004/0247218 A1 | 12/2004 | Ironside et al. |
| 2004/0256613 A1 | 12/2004 | Oda et al. |
| 2004/0256647 A1 | 12/2004 | Lee et al. |
| 2004/0262617 A1 | 12/2004 | Hahm et al. |
| 2005/0001216 A1 | 1/2005 | Adkisson et al. |
| 2005/0001267 A1 | 1/2005 | Miyagawa et al. |
| 2005/0003572 A1 | 1/2005 | Hahn et al. |
| 2005/0009304 A1 | 1/2005 | Zheleva et al. |
| 2005/0014376 A1 | 1/2005 | Shiho et al. |
| 2005/0017351 A1 | 1/2005 | Ravi |
| 2005/0035410 A1 | 2/2005 | Yeo et al. |
| 2005/0040444 A1 | 2/2005 | Cohen |
| 2005/0045983 A1 | 3/2005 | Noda et al. |
| 2005/0054164 A1 | 3/2005 | Xiang |
| 2005/0054180 A1 | 3/2005 | Han et al. |
| 2005/0056827 A1 | 3/2005 | Li et al. |
| 2005/0056892 A1 | 3/2005 | Seliskar |
| 2005/0072995 A1 | 4/2005 | Anthony |
| 2005/0073028 A1 | 4/2005 | Grant et al. |
| 2005/0093021 A1 | 5/2005 | Ouyang et al. |
| 2005/0093154 A1 | 5/2005 | Kottantharayil et al. |
| 2005/0104152 A1 | 5/2005 | Snyder et al. |
| 2005/0104156 A1 | 5/2005 | Wasshuber |
| 2005/0118793 A1 | 6/2005 | Snyder et al. |
| 2005/0118825 A1 | 6/2005 | Nishijima et al. |
| 2005/0121688 A1 | 6/2005 | Nagai et al. |
| 2005/0127451 A1 | 6/2005 | Tsuchiya et al. |
| 2005/0136626 A1 | 6/2005 | Morse |
| 2005/0139860 A1 | 6/2005 | Snyder et al. |
| 2005/0145941 A1 | 7/2005 | Bedell et al. |
| 2005/0145954 A1 | 7/2005 | Zhu et al. |
| 2005/0148161 A1 | 7/2005 | Chen et al. |
| 2005/0156169 A1 | 7/2005 | Chu |
| 2005/0156202 A1 | 7/2005 | Rhee et al. |
| 2005/0161711 A1 | 7/2005 | Chu |
| 2005/0164475 A1 | 7/2005 | Peckerar et al. |
| 2005/0181549 A1 | 8/2005 | Barr et al. |
| 2005/0184302 A1 | 8/2005 | Kobayashi et al. |
| 2005/0205859 A1 | 9/2005 | Currie et al. |
| 2005/0205932 A1 | 9/2005 | Cohen |
| 2005/0211291 A1 | 9/2005 | Bianchi |
| 2005/0212051 A1 | 9/2005 | Jozwiak et al. |
| 2005/0217565 A1 | 10/2005 | Lahreche et al. |
| 2005/0245095 A1 | 11/2005 | Haskell et al. |
| 2005/0263751 A1 | 12/2005 | Hall et al. |
| 2005/0274409 A1 | 12/2005 | Fetzer et al. |
| 2005/0277278 A1 | 12/2005 | Maleville et al. |
| 2005/0280103 A1 | 12/2005 | Langdo et al. |
| 2006/0009012 A1 | 1/2006 | Leitz et al. |
| 2006/0019462 A1 | 1/2006 | Cheng et al. |
| 2006/0024869 A1 | 2/2006 | Lochtefeld et al. |
| 2006/0049409 A1 | 3/2006 | Rafferty et al. |
| 2006/0057825 A1 | 3/2006 | Bude et al. |
| 2006/0073681 A1 | 4/2006 | Han |
| 2006/0105533 A1 | 5/2006 | Chong et al. |
| 2006/0112986 A1 | 6/2006 | Atwater, Jr. et al. |
| 2006/0113603 A1 | 6/2006 | Currie |
| 2006/0128124 A1 | 6/2006 | Haskell et al. |
| 2006/0131606 A1 | 6/2006 | Cheng |
| 2006/0144435 A1 | 7/2006 | Wanlass |
| 2006/0145264 A1 | 7/2006 | Chidambarrao et al. |
| 2006/0160291 A1 | 7/2006 | Lee et al. |
| 2006/0162768 A1 | 7/2006 | Wanlass et al. |
| 2006/0166437 A1 | 7/2006 | Korber |
| 2006/0169987 A1 | 8/2006 | Miura et al. |
| 2006/0175601 A1 | 8/2006 | Lieber et al. |
| 2006/0186510 A1 | 8/2006 | Lochtefeld et al. |
| 2006/0189056 A1 | 8/2006 | Ko et al. |
| 2006/0194418 A1* | 8/2006 | Lee .................. C30B 19/00 438/479 |
| 2006/0197123 A1 | 9/2006 | Lochtefeld et al. |
| 2006/0197124 A1 | 9/2006 | Lochtefeld et al. |
| 2006/0197126 A1 | 9/2006 | Lochtefeld et al. |
| 2006/0202276 A1 | 9/2006 | Kato |
| 2006/0205197 A1 | 9/2006 | Yi et al. |
| 2006/0211210 A1 | 9/2006 | Bhat et al. |
| 2006/0255341 A1* | 11/2006 | Pinnington .......... B82Y 20/00 257/79 |
| 2006/0258075 A1 | 11/2006 | Lochtefeld et al. |
| 2006/0266281 A1 | 11/2006 | Beaumont et al. |
| 2006/0267047 A1 | 11/2006 | Murayama |
| 2006/0292719 A1 | 12/2006 | Lochtefeld et al. |
| 2007/0025670 A1 | 2/2007 | Pan et al. |
| 2007/0029643 A1 | 2/2007 | Johnson et al. |
| 2007/0042538 A1 | 2/2007 | Currie et al. |
| 2007/0051299 A1 | 3/2007 | Ong et al. |
| 2007/0054465 A1* | 3/2007 | Currie .............. H01L 21/76254 438/455 |
| 2007/0054467 A1* | 3/2007 | Currie .............. H01L 21/76254 438/458 |
| 2007/0059875 A1 | 3/2007 | Mishima |
| 2007/0099315 A1* | 5/2007 | Maa .................. H01L 31/105 438/22 |
| 2007/0099329 A1 | 5/2007 | Maa et al. |
| 2007/0102721 A1 | 5/2007 | DenBaars et al. |
| 2007/0105256 A1 | 5/2007 | Fitzgerald |
| 2007/0105274 A1 | 5/2007 | Fitzgerald |
| 2007/0105335 A1 | 5/2007 | Fitzgerald |
| 2007/0181977 A1* | 8/2007 | Lochtefeld ...... H01L 21/823807 257/618 |
| 2007/0187668 A1 | 8/2007 | Noguchi et al. |
| 2007/0187796 A1 | 8/2007 | Rafferty et al. |
| 2007/0196987 A1 | 8/2007 | Chidambarrao et al. |
| 2007/0248132 A1 | 10/2007 | Kikuchi et al. |
| 2007/0249139 A1* | 10/2007 | Gadkaree .......... H01L 21/30604 438/458 |
| 2007/0252215 A1* | 11/2007 | Ieong .............. H01L 21/823807 257/369 |
| 2007/0259528 A1 | 11/2007 | Moriceau et al. |
| 2007/0267722 A1 | 11/2007 | Lochtefeld et al. |
| 2008/0001169 A1 | 1/2008 | Lochtefeld |
| 2008/0038995 A1* | 2/2008 | Small .................. H01L 21/3212 451/37 |
| 2008/0070355 A1 | 3/2008 | Lochtefeld et al. |
| 2008/0073641 A1 | 3/2008 | Cheng et al. |

(56) References Cited

U.S. PATENT DOCUMENTS

| | | | |
|---|---|---|---|
| 2008/0073667 | A1 | 3/2008 | Lochtefeld |
| 2008/0093622 | A1 | 4/2008 | Li et al. |
| 2008/0099785 | A1 | 5/2008 | Bai et al. |
| 2008/0154197 | A1 | 6/2008 | Derrico et al. |
| 2008/0160726 | A1 | 7/2008 | Lim et al. |
| 2008/0187018 | A1 | 8/2008 | Li |
| 2008/0194078 | A1 | 8/2008 | Akiyama et al. |
| 2008/0245400 | A1 | 10/2008 | Li |
| 2008/0257409 | A1 | 10/2008 | Li et al. |
| 2008/0286957 | A1 | 11/2008 | Lee et al. |
| 2008/0296586 | A1 | 12/2008 | Francis et al. |
| 2009/0039361 | A1 | 2/2009 | Li et al. |
| 2009/0042344 | A1 | 2/2009 | Ye et al. |
| 2009/0061589 | A1* | 3/2009 | Maekawa ............ H01L 28/91 438/386 |
| 2009/0065047 | A1 | 3/2009 | Fiorenza et al. |
| 2009/0072284 | A1 | 3/2009 | King et al. |
| 2009/0110898 | A1 | 4/2009 | Levy et al. |
| 2009/0321882 | A1 | 12/2009 | Park |
| 2010/0012976 | A1 | 1/2010 | Hydrick et al. |
| 2010/0025683 | A1 | 2/2010 | Cheng |
| 2010/0072515 | A1 | 3/2010 | Park et al. |
| 2010/0078680 | A1 | 4/2010 | Cheng et al. |
| 2010/0176371 | A1 | 7/2010 | Lochtefeld |
| 2010/0176375 | A1 | 7/2010 | Lochtefeld |
| 2010/0213511 | A1 | 8/2010 | Lochtefeld |
| 2010/0216277 | A1 | 8/2010 | Fiorenza et al. |
| 2010/0252861 | A1 | 10/2010 | Lochtefeld |
| 2010/0308376 | A1 | 12/2010 | Takada et al. |
| 2010/0314627 | A1* | 12/2010 | Sung ............ H01L 21/02376 257/77 |
| 2011/0011438 | A1 | 1/2011 | Li |
| 2011/0086498 | A1 | 4/2011 | Cheng et al. |
| 2012/0017825 | A1 | 1/2012 | D'Evelyn et al. |
| 2012/0032149 | A1* | 2/2012 | Chen ............ B82Y 10/00 257/24 |
| 2015/0249086 | A1* | 9/2015 | Divakaruni ............ H01L 27/092 257/369 |

FOREIGN PATENT DOCUMENTS

| | | |
|---|---|---|
| DE | 10320160 | 8/2004 |
| EP | 0352472 | 6/1989 |
| EP | 0600276 | 6/1994 |
| EP | 0817096 | 1/1998 |
| EP | 1551063 | 7/2005 |
| EP | 1796180 | 6/2007 |
| GB | 2215514 | 9/1989 |
| JP | 2062090 | 3/1990 |
| JP | 7230952 | 8/1995 |
| JP | 10126010 | 5/1998 |
| JP | 10284436 | 10/1998 |
| JP | 10284507 | 10/1998 |
| JP | 11251684 | 9/1999 |
| JP | 11307866 | 11/1999 |
| JP | 2000021789 | 1/2000 |
| JP | 2000216432 | 8/2000 |
| JP | 2000286449 | 10/2000 |
| JP | 2000299532 | 10/2000 |
| JP | 2001007447 | 1/2001 |
| JP | 2001102678 | 4/2001 |
| JP | 3202223 | 8/2001 |
| JP | 2001257351 | 9/2001 |
| JP | 2002118255 | 4/2002 |
| JP | 2002141553 | 5/2002 |
| JP | 2002241192 | 8/2002 |
| JP | 2002293698 | 10/2002 |
| JP | 2003163370 | 6/2003 |
| JP | 3515974 | 4/2004 |
| JP | 2004200375 | 7/2004 |
| JP | 2009177167 | 8/2009 |
| KR | 20030065631 | 8/2003 |
| KR | 20090010284 | 1/2009 |
| TW | 544930 | 8/2003 |
| WO | WO0072383 | 11/2000 |
| WO | WO0101465 | 1/2001 |
| WO | WO0209187 | 1/2002 |
| WO | WO02086952 | 10/2002 |
| WO | WO02088834 | 11/2002 |
| WO | WO03073517 | 9/2003 |
| WO | WO2004004927 | 1/2004 |
| WO | WO2004023536 | 3/2004 |
| WO | WO2005013375 | 2/2005 |
| WO | WO2005048330 | 5/2005 |
| WO | WO2005098963 | 10/2005 |
| WO | WO2005122267 | 12/2005 |
| WO | WO2006025407 | 3/2006 |
| WO | WO2006125040 | 11/2006 |
| WO | WO2008124154 | 10/2008 |

OTHER PUBLICATIONS

"Communication pursuant to Article 94(3) EPC," Application No. 06 770 525.1-2203, Applicant: Taiwan Semiconductor Company, Ltd., Feb. 17, 2011, 4 pages.
68 Applied Physics Letters 7, 1999, pp. 774-779 (trans. of relevant portions attached).
Ames, "Intel Says More Efficient Chips are Coming," PC World, available at: http://www.pcworld.com/printable/article/id,126044/printable.html (Jun. 12, 2006); 4 pages.
Asano et al., "AlGaInN laser diodes grown on an ELO-GaN substrate vs. on a sapphire substrate," Semiconductor Laser Conference (2000) Conference Digest, IEEE 17$^{th}$ International, 2000, pp. 109-110.
Asaoka, et al., "Observation of 1 f$^{x}$/noise of GaInP/GaAs triple barrier resonant tunneling diodes," AIP Conf. Proc., vol. 780, Issue 1, 2005, pp. 492-495.
Ashby, et al., "Low-dislocation-density GaN from a single growth on a textured substrate," Applied Physics Letters, vol. 77, No. 20, Nov. 13, 2000, pp. 3233-3235.
Ashley, et al., "Heterogeneous InSb Quantum Well Transistors on Silicon for Ultra-High Speed, Low Power Logic Applications," 43 Electronics Letters 14, Jul. 2007, 2 pages.
Bai et al., "Study of the Defect Elimination Mechanisms in Aspect Ratio Trapping Ge Growth," Applied Physics Letters, vol. 90, 2007, 3 pages.
Bakkers et al., "Epitaxial Growth on InP Nanowires on Germanium," Nature Materials, vol. 3, Nov. 2004, pp. 769-773
Baron et al., "Chemical Vapor Deposition of Ge Nanocrystals on $SiO_2$," Applied Physics Letters, vol. 83, No. 7, Aug. 18, 2003, pp. 1444-1446.
Bean et al., "$Ge_xSi_{1-x}$/Si strained-later Superlattice grown by molecular beam Epitaxy," Journal of Vacuum Science Technology A2 (2), Jun. 1984, pp. 436-440.
Beckett et al., "Towards a reconfigurable nanocomputer platform," ACM International Conference Proceeding Series, vol. 19, 2002, pp. 141-150.
Beltz et al., "A Theoretical Model for Threading Dislocation Reduction During Selective Area Growth," Materials Science and Engineering, A234-236, 1997, pp. 794-797.
Belyaev, et al., "Resonance and current instabilities in AlN/GaN resonant tunneling diodes," 21 Physica E 2-4, 2004, pp. 752-755.
Berg, J., "Electrical Characterization of Silicon Nanogaps," Doktorsavhandlingar vid Chalmers Tekniska Hagskola, 2005, No. 2355, 2 pages.
Bergman et al., "RTD/CMOS Nanoelectronic Circuits: Thin-Film InP-based Resonant Tunneling Diodes Integrated with CMOS circuits," 20 Electron Device Letters 3, 1999, pp. 119-122.
Blakeslee, "The Use of Superlattices to Block the Propagation of Dislocations in Semiconductors," Mat. Res. Soc. Symposium Proceedings 148, 1989, pp. 217-227.
Bogumilowicz et al., "Chemical Vapour Etching of Si, SiGe and Ge with HCL: Applications to the Formation of Thin Relaxed SiGe Buffers and to the Revelation of Threading Dislocations," 20 Semicond. Sci. Tech. 2005, pp. 127-134.
Borland, "Novel Device structures by selective epitaxial growth (SEG)," Electron Devices Meeting, vol. 33, 1987, pp. 12-15.

(56) References Cited

OTHER PUBLICATIONS

Bryskiewicz, "Dislocation filtering in SiGe and InGaAs buffer layers grown by selective lateral overgrowth method," Applied Physics Letters, vol. 66, No. 10, Mar. 6, 1995, pp. 1237-1239.
Burenkov et al., "Corner Effect in Double and Triple Gate FinFET5 "European solid-state device research, 33rd Conference on Essderc '03 Sep. 16-18, 2003, Piscataway, NJ, USA, IEEE, vol. 16, pp. 135-138, XPo10676716.
Bushroa et al., "Lateral epitaxial overgrowth and reduction in defect density of 3C-SiC on patterned Si substrates," Journal of Crystal Growth, vol. 271, No. 1-2, Oct. 15, 2004, pp. 200-206.
Calado, et al., "Modeling of a resonant tunneling diode optical modulator," University of Algarve, Department of Electronics and Electrical Engineering, 2005, pp. 96-99.
Campo et al., "Comparison of Etching Processes of Silicon and Germanium in SF6-O2 Radio-Frequency Plasma," 13 Journal of Vac. Sci. Tech., B-2, 1995, pp. 235-241.
Cannon et al., "Monolithic Si-based Technology for Optical Receiver Circuits," Proceedings of SPIE, vol. 4999, 2003, pp. 145-155.
Chan et al., "Influence of Metalorganic Sources on the Composition Uniformity of Selectively Grown $Ga_xIn_{1-x}P$," Japan. Journal of Applied Physics, vol. 33, 1994, pp. 4812-4819.
Chang et al. "3-D simulation of strained Si/SiGe heterojunction FinFETs" Semiconductor Device Research Symposium, Dec. 10-12, 2003, pp. 176-177.
Chang et al., "Effect of growth temperature on epitaxial lateral overgrowth of GaAs on Si substrate," Journal of Crystal Growth, vol. 174, No. 1-4, Apr. 1997, pp. 630-634.
Chang et al., "Epitaxial Lateral Overgrowth of Wide Dislocation-Free GaAs on Si Substrates," Electrochemical Society Proceedings, vol. 97-21, May 13, 1998, pp. 196-200.
Chau et al., Opportunities and Challenges of III-V Nanoelectronics for Future High-Speed, Low Power Logic Applications, IEEE CSIC Digest, 2005, pp. 17-20.
Chen et al., "Dislocation reduction in GaN thin films via lateral overgrowth from trenches," Applied Physics Letters, vol. 75, No. 14, Oct. 4 1999, pp. 2062-2063.
Chengrong, et al., "DBRTD with a high PVCR and a peak current density at room temperature," Chinese Journal of Semiconductors vol. 26, No. 10, Oct. 2005, pp. 1871-1874.
Choi et al., "Monolithic Integration of GaAs/AlGaAs Double-Heterostructure LEDs and Si MOSFETs," Electron Device Letters, vol. EDL-7, No. 9, Sep. 1986, 3 pages.
Choi et al., "Monolithic Integration of Si MOSFETs and GaAs MESFETs," Electron Device Letters, vol. EDL-7, No. 4, Apr. 1986, 3 pages.
Choi, et al., "Low-voltage low-power K-band balanced RTD-based MMIC VCO," 2006 IEEE, Department of EECS, Korea Advanced Institute of Science and Technology, 2006, pp. 743-746.
Cloutier et al., "Optical gain and stimulated emission in periodic nanopatterned crystalline silicon," Nature Materials, Nov. 2005, 5 pages.
Currie et al., "Carrier Mobilities and Process Stability of Strained Si n- and p-MOSFETs on SiGe Virtual Substrates," J. Vacuum Science Technology, B, vol. 19, No. 6, 2001, pp. 2268-2279.
Dadgar et al., "MOVPE growth of GaN on Si (111) substrates," Journal of Crystal Growth, vol. 248, Feb. 1, 2003, pp. 556-562.
Datta et al., "Silicon and III-V Nanoelectronics," IEEE International Conference on Indium Phosphide & Related Materials, 2005, pp. 7-8.
Datta et al., "Ultrahigh-Speed 0.5 V Supply Voltage In0.7Ga0.3As Quantum-Well Transistors on Silicon Substrate," 28 Electron Device Letters 8, 2007, pp. 685-687.
Davis et al., "Lateral epitaxial overgrowth of and defect reduction in GaN thin films," Lasers and Electro-Optics Society Annual Meeting (1998) LEOS '98. IEEE, vol. 1, Dec. 1-4, 1998, pp. 360-361.
De Boeck et al., "The fabrication on a novel composite GaAs/SiO$_2$ nucleation layer on silicon for heteroepitaxial overgrowth by molecular beam Epitaxy," Material Science and Engineering, B9, 1991, pp. 137-141.

Donaton et al., "Design and Fabrication of MOSFETs with a Reverse Embedded SiGe (Rev. e-SiGe) Structure," 2006 IEDM, pp. 465-468.
Dong, Y., et al, "Selective area growth of InP through narrow openings by MOCVD and its application to InP HBT," 2003 International Conference on Indium Phosphide and Related Materials, May 12-16, 2003, pp. 389-392.
European Patent Office, Extended European Search Report and Search Opinion dated Jan. 26, 2011 in EP Patent Application No. 10003084.0-2203 (9 pages).
European Search Report issued by the European Patent Office on Dec. 15, 2010 in European Patent Application No. 10002884.4 (10 pages).
Examination Report in European Patent Application No. 06800414.2, mailed Mar. 5, 2009, 3 pages.
Fang et al., "Electrically pumped hybrid AlGaInAs-silicon evanescent laser," 14 Optics Express 20, 2006, pp. 9203-9210
Feltin et al., "Epitaxial lateral overgrowth of GaN on Si (111)," Journal of Applied Physics, vol. 93, No. 1, Jan. 1, 2003, pp. 182-185.
Feng et al., "Integration of Germanium-on Insulator and Silicon Substrate," 27 Electron Device Letters 11, 2006, pp. 911-913.
Fiorenza et al., "Film Thickness Constraints for Manufacturable Strained Silicon CMOS," 19 Semiconductor Science Technology, 2004, p. L4.
Fischer et al., "Elastic stress relaxation in SiGe epilayers on patterned Si substrates," 75 Journal of Applied Physics 1, 1994, pp. 657-659.
Fischer et al., "State of stress and critical thickness of Strained small-area SiGe layers," Phys. Stat. Sol. (a) vol. 171, 1999, pp. 475-485.
Fitzgerald et al., "Elimination of Dislocations in Heteroepitaxial MBE and RTCVD $Ge_xSi_{1-x}$ Grown on Patterned Si Substrates," Journal of Electronic Materials, vol. 19, No. 9, 1990, pp. 949-955.
Fitzgerald et al., "Epitaxial Necking in GaAs Growth on Pre-patterned Si Substrates," Journal of Electronic Materials, vol. 20, No. 10, 1991, pp. 839-853.
Fitzgerald et al., "Nucleation Mechanisms and the Elimination of Misfit Dislocations at Mismatched Interfaces by Reduction in Growth Areas," Journal of Applied Physics, vol. 65, No. 6, Mar. 15, 1989, pp. 2220-2237.
Fitzgerald et al., "Structure and recombination in InGaAs/GaAs heterostructures," 63 Journal of Applied Physics, vol. 3, 1988, pp. 693-703.
Fitzgerald et al., "Totally relaxed $Ge_xSi_{1-x}$ layers with low threading dislocation densities grown on Si Substrates," vol. 59, Applied Physics Letters 7, 1991, pp. 811-813.
Fitzgerald, "The Effect of Substrate Growth Area on Misfit and Threading Dislocation Densities in Mismatched Heterostructures," Journal of Vacuum Science Technology, vol. 7, No. 4, Jul./Aug. 1989, pp. 782-788.
Gallagher et al., "Development of the magnetic tunnel junction MRAM at IBM: From first junctions to a 16-Mb MRAM demonstrator chip," 50 IBM J. Research & Dev. 1, Jan. 2006, pp. 5-23A.
Gallas et al., "Influence of Doping on Facet Formation at the $SiO_2$/Si Interface," Surface Sci. 440, 1999, pp. 41-48.
Geppert, "Quantum transistors: toward nanoelectronics," IEEE Spectrum, Sep. 2000, pp. 46-51.
Gibbon et al., "Selective-area low-pressure MOCVD of GaInAsP and related materials on planar InP substrates," Semicond. Sci. Tech. vol. 8, 1993, pp. 998-1010.
Glew et al., "New DFB grating structure using dopant-induced refractive index step," J. Crystal Growth 261, 2004, pp. 349-354.
Golka, et al., "Negative differential resistance in dislocation-free GaN/AlGan double-barrier diodes grown on bulk GaN," 88 Applied Physics Letters 17, Apr. 2006, pp. 172106-1-172106-3.
Goodnick, S.M., "Radiation Physics and Reliability Issues in III-V Compound Semiconductor Nanoscale Heterostructure Devices," Final Technical Report, Arizona State Univ. Dept. Electrical & Computer Eng, 80 pages, 1996-1999.
Gould et al., "Magnetic resonant tunneling diodes as voltage-controlled spin selectors," 241 Phys. Stat. Sol. (B), vol. 3, 2004, pp. 700-703.
Groenert et al., "Monolithic integration of room-temperature cw GaAs/AlGaAs lasers on Si substrates via relaxed graded GeSi buffer layers," 93 Journal of Applied Physics, No. 362, Jan. 2003, pp. 362-367.

(56) References Cited

OTHER PUBLICATIONS

Gruber, et al., "Semimagnetic Resonant Tunneling Diodes for Electron Spin Manipulation," Nanostructures: Physics & Technology, 8th International Symposium, 2000, pp. 483-486.
Gustafsson et al., "Cathodoluminescence from relaxed $Ge_xSi_{1-x}$ grown by heteroepitaxial lateral overgrowth," Journal of Crystal Growth 141, 1994, pp. 363-370.
Gustafsson et al., "Investigations of high quality $Ge_xSi_{1-x}$ grown by heteroepitaxial lateral overgrowth using cathodoluminescence," Inst. Phys. Conf. Ser., No. 134, Section 11, Apr. 1993, pp. 675-678.
Hammerschmidt, "Intel to Use Trigate Transistors from 2009 on," EETIMES Online, available at: http://www.eetimes.com/showArticle.jhtml?articleID=189400035 (Jun. 12, 2006). 1 page.
Hasegawa, et al., "Sensing Terahertz Signals with III-V Quantum Nanostructures," Quantum Sensing: Evolution and Revolution from Past to Future, SPIE 2003, pp. 96-105.
Hayafuji et al., Japan, Journal of Applied Physics, vol. 29, 1990, pp. 2371.
Hersee et al., "The Controlled Growth of GaN Nanowires," Nano Letters, vol. 6, No. 8, 2006, pp. 1808-1811.
Hiramatsu et al., "Fabrication and characterization of low defect density GaN using facet-controlled epitaxial lateral overgrowth (FACELO)," Journal of Crystal Growth, vol. 221, Dec. 2000, pp. 316-326.
Hollander et al., "Strain and Misfit Dislocation Density in Finite Lateral Size $Si_{1-x}Ge_x$/Si Films Grown by Selective Epitaxy," Thin Solid Films, vol. 292, 1997, pp. 213-217.
Hu et al., "Growth of Well-Aligned Carbon Nanotube arrays on Silicon Substrates Using Porous Alumina Film as a Nanotemplate," 79 Applied Physics Letters 19, 2001, 3 pages.
Yanlong, et al., "Monolithically fabricated OEICs using RTD and MSM," Chinese Journal Semiconductors vol. 27, No. 4, Apr. 2006, pp. 641-645.
Huang et al., "Electron and Hole Mobility Enhancement in Strained SOI by Wafer Bonding," 49 IEEE Transactions on Electron Devices 9, 2002, pp. 1566-1570.
Ying-Long, et al., "Resonant tunneling diodes and high electron mobility transistors integrated on GaAs substrates," Chinese Physics Letters 23, vol. 3, Mar. 2006, pp. 697-700.
Hydrick et al., "Chemical Mechanical Polishing of Epitaxial Germanium on $SiO_2$-patterned Si(001) Substrates," ECS Transactions, 16 (10), 2008, (pp. 237-248).
Intel Press Release, "Intel's Tri-Gate Transistor to Enable Next Era in Energy-Efficient Performance," Intel Corporation (Jun. 12, 2006). 2 pages.
Intel to Develop Tri-Gate Transistors Based Processors, available at: http://news.techwhack.com/3822/tri-gate-transistors/ (Jun. 13, 2006) 6 pages.
International Preliminary Report on Patentability for International Application No. PCT/US2006/019152 mailed Nov. 29, 2007, 2 pages.
International Preliminary Report on Patentability for International Application No. PCT/US2006/029247 mailed Feb. 7, 2008, 12 pages.
International Preliminary Report on Patentability for International Application No. PCT/US2006/033859 mailed Mar. 20, 2008, 14 pages.
International Preliminary Report on Patentability for International Application No. PCT/US2007/019568 mailed Mar. 19, 2009, 10 pages.
International Preliminary Report on Patentability for International Application No. PCT/US2007/020181 mailed Apr. 2, 2009, 9 pages.
International Preliminary Report on Patentability for International Application No. PCT/US2007/020777 mailed Apr. 9, 2009, 12 pages.
International Preliminary Report on Patentability for International Application No. PCT/US2007/021023 mailed Apr. 9, 2009, 8 pages.
International Preliminary Report on Patentability for International Application No. PCT/US2007/022392 mailed Apr. 30, 2009, 14 pages.
International Search Report and Written Opinion for International Application No. PCT/US2006/019152 mailed Oct. 19, 2006, 11 pages.
International Search Report and Written Opinion for International Application No. PCT/US2006/029247 mailed May 7, 2007, 19 pages.
International Search Report and Written Opinion for International Application No. PCT/US2008/068377, mailed Jul. 6, 2009, 19 pages.
International Search Report and Written Opinion for International Application No. PCT/US2006/033859 mailed Sep. 12, 2007, 22 pages.
International Search Report and Written Opinion for International Application No. PCT/US2007/007373, dated Oct. 5, 2007, 13 pages.
International Search Report and Written Opinion for International Application No. PCT/US2007/019568 mailed Feb. 6, 2008, 13 pages.
International Search Report and Written Opinion for International Application No. PCT/US2007/020181 mailed Jan. 25, 2008, 15 pages.
International Search Report and Written Opinion for International Application No. PCT/US2007/020777 mailed Feb. 8, 2008, 18 pages.
International Search Report and Written Opinion for International Application No. PCT/US2007/021023 mailed Jun. 6, 2008, 10 pages.
International Search Report and Written Opinion for International Application No. PCT/US2007/022392 mailed Apr. 11, 2008, 20 pages.
International Search Report for International Application No. PCT/US2006/019152, mailed May 17, 2005. 11 pages.
International Technology Roadmap for Semiconductors—Front End Processes, pp. 1-62 (2005).
Ipri et al., "MONO/POLY technology for fabricating low-capacitance CMOS integrated circuits," Electron Devices, IEEE Transactions, vol. 35, No. 8, Aug. 1988 pp. 1382-1383.
Ishibashi, et al., "3rd Topical Workshop on Heterostructure Microelectronics for Information Systems Applications," Aug.-Sep. 1998, 115 pages.
Ishitani et al., "Facet Formation in Selective Silicon Epitaxial Growth," 24 Japan, Journal of Applied Physics, vol. 10, 1985, pp. 1267-1269.
Ismail et al., "High-quality GaAs on Sawtooth-patterned Si Substrates," 59 Applied Physics Letters 19, 1991, pp. 2418-2420.
Jain et al., "Stresses in strained GeSi stripes and quantum structures: calculation using the finite element method and determination using micro-Raman and other measurements," Thin Solid Films 292, 1997, pp. 218-226.
Jeong, et al., "Performance improvement of InP-based differential HBT VCO using the resonant tunneling diode," 2006 International Conf. on Indium Phosphide and Related Mat. Conf. Proc., pp. 42-45.
Ju et al., "Epitaxial lateral overgrowth of gallium nitride on silicon substrate," Journal of Crystal Growth, vol. 263, No. 1-4, Mar. 1, 2004, pp. 30-34.
Kamins et al., "Kinetics of Selective Epitaxial Depostion of Si1-xGex," Hewlett-Packard Company, Palo Alto, CA, Appl. Phys. Lett. 61 (6), Aug. 10, 1992 (pp. 669-671).
Kamiyama, et al., "UV laser diode with 350.9-nm-lasing wavelength grown by hetero-epitaxial-lateral overgrowth technology," Selected Topics in Quantum Electronics, IEEE Journal of Selected Topics in Quantum Electronics, vol. 11, No. 5, Sep.-Oct. 2005, pp. 1069-1073.
Kamiyama, et al., "UV light-emitting diode fabricated on hetero-ELO-grown $Al_{0.22}Ga_{0.78}N$ with low dislocation density," Physica Status Solidi A, vol. 192, No. 2, Aug. 2002, pp. 296-300.
Kawai, et al., "Epitaxial Growth of InN Films and InN Nano-Columns by RF-MBE," The Institute of Electronics, Information and Communication Engineers, Gijutsu Kenkyu, vol. 13, No. 343 (CPM2003 102-116), 2003, pp. 33-37.
Kazi et al., "Realization of GaAs/AlGaAs Lasers on Si Substrates Using Epitaxial Lateral Overgrowth by Metalorganic Chemical Vapor Deposition," Japan, Journal of Applied Physics, vol. 40, 2001, pp. 4903-4906.
Kidoguchi et al., "Air-bridged lateral epitaxial overgrowth of GaN thin Films," Applied Physics Letters, vol. 76, No. 25, Jun. 19, 2000, pp. 3768-3770.

(56) References Cited

OTHER PUBLICATIONS

Kim et al., "Silicon-Based Field-induced Band-to-Band Tunneling Effect Transistor," IEEE Electron Device Letters, No. 25, No. 6, 2004, pp. 439-441.

Kim et al., "GaN nano epitaxial lateral overgrowth on holographically patterned substrates," School of Physics and Inter-University Semiconductor Research Center, Seoul National University, Aug. 25-27, 2003, pp. 27-28.

Kimura et al., "Vibronic Fine Structure Found in the Blue Luminescence from Silicon Nanocolloids," Japan, Journal of Applied Physics, vol. 38, 1999, pp. 609-612.

Klapper, "Generation and Propagation of Dislocations During Crystal Growth," Mat. Chem. and Phys. vol. 66, 2000, pp. 101-109.

Knall et al., "Threading Dislocations in GaAs Grown with Free Sidewalls on Si mesas," Journal of Vac. Sci. Technol. B, vol. 12, No. 6, Nov./Dec. 1994, pp. 3069-3074.

Kollonitsch, et al., "Improved Structure and Performance of the GaAsSb/InP Interface in a Resonant Tunneling Diode," Journal of Crystal Growth, vol. 287, 2006, pp. 536-540.

Krishnamurthy, et al., "I-V characteristics in resonant tunneling devices: Difference Equation Method," Journal of Applied Physics, vol. 84, Issue 9, Condensed Matter: Electrical and Magnetic Properties (PACS 71-76), 1998, 9.

Krost et al., "GaN-based Optoelectronics on Silicon Substrates," Materials Science & Engineering, B93, 2002, pp. 77-84.

Sudirgo et al., "Si-Based Resonant Interband Tunnel Diode/CMOS Integrated Memory Circuits," Rochester Institute of Technology, IEEE, 2006, pp. 109-112.

Kusakabe, K. et al., Characterization of Overgrown GaN layers on Nano-Columns Grown by RF-Molecular Beam Epitaxy, Japan, Journal of Applied Physics, Part 2, vol. 40, No. 3A, 2001, pp. L192-L194

Kushida et al., "Epitaxial growth of $PbTiO_3$ films on $SrTiO_3$ by RF Magnetron sputtering," Ultrasonics, Ferroelectrics and Frequency Control, IEEE Transactions on Ultrasonics Ferroelectrics and Frequency Control, vol. 38, No. 6, No. 1991, pp. 656-662.

Kwok, "Barrier-Injection Transit Time Diode," Complete Guide to Semiconductor Devices, $2^{nd}$ ed., Chapter 18, 2002, pp. 137-144.

Lammers, "Trigate and High-k stack up vs. planar," EETIMES Online, available at: http://www.eetimes.com/showArticle.jhtml?articleID=188703323&pgno=2&printable=true (Jun. 12, 2006). 2 pages.

Langdo et al., "High Quality Ge on Si by Epitaxial Necking," Applied Physics Letters, vol. 76, No. 25, Jun. 19, 2000, pp. 3700-3702.

Langdo, "Selective SiGe Nanostructures," PhD Thesis, Massachusetts Institute of Technology, Jun. 2001, 215 pages.

Lee et al., "Growth of GaN on a nanoscale periodic faceted Si substrate by metal organic vapor phase epitaxy," Compound Semiconductors: Post-Conference Proceedings, Aug. 25-27, 2003, pp. 15-21.

Lee et al., "Strain-relieved, Dislocation-free $In_xGa_{1-x}As/GaAs(001)$ Heterostructure by Nanoscale-patterned Growth," Applied Physics Letters, vol. 85, No. 18, Nov. 1, 2004, pp. 4181-4183.

Li et al., "Defect Reduction of GasAs Epitaxy on Si (001) Using Selective Aspect Ratio Trapping," 91 Applied Physics Letters, 2007, pp. 021114-1-021114-3.

Li et al., "Heteroepitaxy of High-quality Ge on Si by Nanoscale Ge Seeds Grown through a Thin Layer $SiO_2$," Applied Physics Letters, vol. 85, No. 11, Sep. 13, 2004, pp. 1928-1930.

Li et al., "Monolithic Integration of GaAs/InGaAs Lasers on Virtual Ge Substrates via Aspect-Ratio Trapping," Journal of The Electrochemical Society, vol. 156, No. 7, 2009, pp. H574-H578.

Li et al., "Morphological Evolution and Strain Relaxation of Ge Islands Grown on Chemically Oxidized Si (100) by Molecular-Beam Epitaxy," Journal of Applied Physics, vol. 98, 2005, pp. 073504-1-073504-8.

Li et al., "Selective Growth of Ge on Si (100) through Vias of $Si_{o2}$ Nanotemplate Using Solid Source Molecular Beam Epitaxy," Applied Physics Letters, vol. 83, No. 24, Dec. 15, 2003, pp. 5032-5034.

Liang et al., "Critical Thickness enhancement of Epitaxial SiGe films Grown on Small Structures," Journal of Applied Physics, vol. 97, 2005, pp. 043519-1-043519-7.

Lim et al.,"Facet Evolution in Selective Epitaxial Growth of Si by cold-wall ultrahigh vacuum chemical vapor deposition," Journal of Vac. Sci. Tech., vol. B 22, No. 2, 2004, pp. 682.

Liu et al., "High Quality Single-crystal Ge on Insulator by Liquid-phase Epitaxy on Si Substrates," Applied Physics Letters, vol. 84, No. 14, Apr. 4, 2004, pp. 2563-2565.

Liu et al., "Rapid Melt Growth of Germanium Crystal with Self Aligned Microcrucibles on Si Substrates," Journal of the Electrochemical Society, vol. 152, No. 8, 2005, pp. G688-G693.

Loo et al., "Successful Selective Epitaxial $Si_{1-x}Ge_x$ Deposition Process for HBT-BiCMOS and High Mobility Heterojunction pMOS Applications," 150 Journal of Electrochemical Society 10, 2003, pp. G638-G647.

Lourdudoss et al., "Semi-insulating epitaxial layers for optoelectronic devices," Semiconducting and Insulating Materials Conference, SIMC-XI, 2000, pp. 171-178.

Luan et al., "High-quality Ge Epilayers on Si with Low Threading-dislocation Densities," Applied Physics Letters, vol. 75, No. 19, Nov. 8, 1999, pp. 2909-2911.

Luan, "Ge Photodetectors for Si Microphotonics," PhD Thesis, Massachusetts Institute of Technology, Department of Materials Science & Engineering, Jan. 12, 2001, 155 pages.

Lubnow et al., "Effect of III/V-Compound Epitaxy on Si Metal-Oxide-Semiconductor Circuits," Japan, Journal of Applied Physics, vol. 33, 1994, pp. 3628-3634.

Luo et al., Enhancement of (IN,Ga)N Light-Emitting Diode Performance by Laser Liftoff and Transfer From Sapphire to Silicon, IEEE Photonics Technology Letters, vol. 14, No. 10, 2002, pp. 1400-1402.

Luryi et al., "New Approach to the High Quality Epitaxial Growth of Latticed-Mismatched Materials," Applied Physics Letters, vol. 49, No. 3, Jul. 21, 1986, pp. 140-142.

Ma, et al., "A small signal equivalent circuit model for resonant tunneling diode," Chinese Physics Letters, vol. 23, No. 8, Aug. 2006, pp. 2292-2295.

Ma, et al., "Fabrication on An AlAs/In0.53/Ga0.47/As/InAs Resonant tunneling diode on InP substrate for high-speed circuit applications," 27 Chinese J. Semiconductors 6, Jun. 2006, pp. 959-962.

Maekawa, et al., "High PVCR Si/Si1-x/Gex DW RTD formed with a new triple-layer buffer," Materials Science in Semiconductor Processing, vol. 8, 2005, pp. 417-421.

Maezawa, et al., "Metamorphic resonant tunneling diodes and its application to chaos generator ICs," 44 Jap. J. Applied Physics, Part 1, No. 7A, Jul. 2005, pp. 4790-4794.

Maezawa, et al., "InP-based resonant tunneling diode/HEMT integrated circuits for ultrahigh-speed operation," IEEE Nagoya University, Institute for Advanced Research, 2006, pp. 252-257.

Martinez et al., "Characterization of GaAs Conformal Layers Grown by Hydride Vapour Phase Epitaxy on Si Substrates by Microphotoluminescence Cathodoluminescence and MicroRaman," Journal of Crystal Growth, vol. 210, 2000, pp. 198-202.

Matsunaga et al., "A New Way to Achieve Dislocation-Free Heteroepitaxial Growth by Molecular Beam Epitaxy: Vertical Microchannel Epitaxy," Journal of Crystal Growth, vol. 237-239, 2002, pp. 1460-1465.

Matthews et al., "Defects in epitaxial Multilayers—Misfits Dislocations," Journal of Crystal Growth, vol. 27, 1974, pp. 118-125.

Monroy, et al., "High UV/visible Contrast Photodiodes Based on Epitaxial Lateral Overgrown GaN layers," Electronics Letters, vol. 35, No. 17, Aug. 19, 1999, pp. 1488-1489.

Nakano et al., "Epitaxial Lateral Overgrowth of AlN Layers on Patterned Sapphire Substrates," Source: Physica Status Solidi A, vol. 203, No. 7, May 2006, pp. 1632-1635.

Nam et al., "Lateral Epitaxy of Low Defect Density GaN Layers via Organometallic Vapor Phase Epitaxy," Applied Physics Letters, vol. 71, No. 18, Nov. 3, 1997, pp. 2638-2640.

Naoi et al., "Epitaxial Lateral Overgrowth of GaN on Selected-area Si (111) Substrate with Nitrided Si Mask," Journal of Crystal Growth, vol. 248, 2003, pp. 573-577.

(56) References Cited

OTHER PUBLICATIONS

Naritsuka et al., "InP Layer Grown on (001) Silicon Substrate by Epitaxial Lateral Overgrowth," Japan, Journal of Applied Physics, vol. 34, 1995, pp. L1432-L1435.
Naritsuka et al., "Vertical Cavity Surface Emitting Laser Fabricated on GaAs Laterally Grown on Si Substrate," Electrochemical Society Proceedings, vol. 97, No. 21, pp. 86-90.
Neudeck, et al., "Novel silicon Epitaxy for advanced MOSFET devices," Electron Devices Meeting, IEDM Technical Digest International, 2000, pp. 169-172.
Neumann et al., "Growth of III-V Resonant Tunneling Diode on Si Substrate with LP-MOVPE," Journal of Crystal Growth, vol. 248, 2003, pp. 380-383.
Noda, et al., "Current-voltage characteristics in double-barrier resonant tunneling diodes with embedded GaAs quantum rings," Physica E 32, 2006, pp. 550-553.
Norman, et al., "Characterization of MOCVD Lateral Epitaxial Overgrown III-V Semiconductor Layers on GaAs Substrates," Compound Semiconductors, Aug. 25-27, 2003, pp. 45-46.
Notification of Transmittal of the International Search Report and the Written Opinion of the International Searching Authority for PCT/US2010/029552, Applicant: Taiwan Semiconductor Manufacturing Company, Ltd., May 26, 2010, 14 pages.
Oehrlein et al., "Studies of the Reactive Ion Etching of SiGe Alloys," J. Vac. Sci. Tech, A9, No. 3, May/Jun. 1991, pp. 768-774.
Orihashi, et al., "Experimental and theoretical characteristics of subterahertz and terahertz oscillations of resonant tunneling diodes integrated with slot antennas," 44 Jap. J. Applied Physics, Part 1, No. 11, Nov. 2005, pp. 7809-7815.
Parillaud et al., "High Quality InP on Si by Conformal Growth," Applied Physics Letters, vol. 68, No. 19, May 6, 1996, pp. 2654-2656.
Park et al., "Defect Reduction and its Mechanism of Selective Ge Epitaxy in Trenches on Si(001) Substrates Using Aspect Ratio Trapping," Mat. Res. Society Symp. Proc., vol. 994, 2007, 6 pages.
Park et al., "Fabrication of Low-Defectivity, Compressively Strained Geon $Si_{0.2}G^e_{0.8}$ Structures Using Aspect Ratio Trapping," Journal of the Electrochemical Society, vol. 156, No. 4, 2009, pp. H249-H254.
Park et al., "Growth of Ge Thick Layers on Si (001) Substrates Using Reduced Pressure Chemical Vapor Deposition," 45 Japan, Journal of Applied Physics, vol. 11, 2006, pp. 8581-8585.
Partial International Search for International Application No. PCT/US2006/033859 mailed Jun. 22, 2007, 7 pages.
Partial International Search Report for International Application No. PCT/US2008/004564 completed Jul. 22, 2009, mailed Oct. 16, 2009, 5 pages.
Partial International Search Report for International Application No. PCT/US2008/068377, completed Mar. 19, 2008, mailed Apr. 22, 2008, 3 pages.
PCT International Search Report of PCT/US2009/057493, from PCT/ISA/210, mailed Mar. 22, 2010, Applicant: Amberwave System Corporation et al., 2 pages.
Pidin et al., "MOSFET Current Drive Optimization Using Silicon Nitride Capping Layer for 65-nm Technology Node," Symposium on VLSI Technology, Dig. Tech. Papers, 2004, pp. 54-55.
Piffault et al., "Assessment of the Strain of InP Films on Si Obtained by HVPE Conformal Growth," Indium Phosphide and Related Materials, Conference Proceedings, Sixth International Conference on Mar. 27-31, 1994, pp. 155-158.
Pribat et al., "High Quality GaAs on Si by Conformal Growth," Applied Physics Letters, vol. 60, No. 17, Apr. 27, 1992, pp. 2144-2146.
Prost, ed. "QUDOS Technical Report," 2002-2004, 77 pages.
Prost, et al., "High-speed InP-based resonant tunneling diode on silicon substrate," Proceedings of the 31st European Solid-State Device Research Conf., 2005, pp. 257-260.
Radulovic, et al., "Transient Quantum Drift-Diffusion Modelling of Resonant Tunneling Heterostructure Nanodevices," Physics of Semiconductors: $27^{th}$ International Conference on the Physics of Semiconductors—ICPS-27, Jun. 2005 AIP Conf. Proc., pp. 1485-1486.
Reed et al., "Realization of a Three-Terminal Resonant Tunneling Device: The Bipolar Quantum Resonant Tunneling Transistor," 54 Applied Physics Letters 11, 1989, p. 1034.
Ren et al., "Low-dislocation -density, Nonplanar GaN Templates for Buried Heterostructure Lasers Grown by Lateral Epitaxial Overgrowth," Applied Physics Letters, vol. 86, No. 11, Mar. 14, 2005, pp. 111901-1-111901-1-3.
Rim et al., "Enhanced Hole Mobilities in Surface-Channel Strained-Si p-MOSFETs," 1995 IEDM, pp. 517-520.
Rim et al., "Fabrication and Mobility Characteristics of Ultra-thin Strained Si Directly on Insulator (SSDOI) MOSFETs," IEDM Tech. Dig., 2003, pp. 49-52.
Ringel et al., "Single-junction InGaP/GaAs Solar Cells Grown on Si Substrates with SiGe Buffer Layers," Prog. Photovolt., Res. & Applied, vol. 10, 2002, pp. 417-426.
Rosenblad et al., "A Plasma Process for Ultrafast Deposition of SiGe Graded Buffer Layers," 76 Applied Physics Letters 4, 2000, pp. 427-429.
Sakai, "Defect Structure in Selectively Grown GaN Films with Low Threading Dislocation Density," Applied Physics Letters 71, vol. 16, 1997, pp. 2259-2261.
Sakai, "Transmission Electron Microscopy of Defects in GaN Films Formed by Epitaxial Lateral Overgrowth," 73 Applied Physics Letters 4, 1998, pp. 481-483.
Sakawa et al., "Effect of Si Doping on Epitaxial Lateral Overgrowth of GaAs on GaAs-Coated Si Substrate," Japan, Journal of Applied Physics, vol. 31, 1992, pp. L359-L361.
Pae, et al., "Multiple Layers of Silicon-on-Insulator Islands Fabrication by Selective Epitaxial Growth," Electron Device Letters, IEEE, vol. 20, No. 5, May 1999, pp. 194-196.
Sass, et al., "Strain in GaP/GaAs and GaAs/GaP resonant tunneling heterostructures," Journal of Crystal Growth, vol. 248, Feb. 2003, pp. 375-379.
Schaub, et al., "Resonant-Cavity-Enhanced High-Speed Si photodiode Grown by Epitaxial Lateral Overgrowth," Photonics Technology Letters, IEEE, vol. 11, No. 12, Dec. 1999, pp. 1647-1649.
Seabaugh et al., Promise of Tunnel Diode Integrated Circuits, Tunnel Diode and CMOS/HBT Integration Workshop, Naval Research Laboratory, Dec. 9, 1999, 13 pages.
Shahidi, et al., "Fabrication of CMOS on Ultrathin SOI Obtained by Epitaxial Lateral Overgrowth and Chemical-Mechanical Polishing," Electron Devices Meeting, Technical Digest, International, Dec. 9-12, 1990, pp. 587-590.
Shichijo et al., "Co-Integration of GaAs MESFET & Si CMOS Circuits," 9 Elec. Device Letters 9, Sep. 1988, pp. 444-446.
Shubert, E.F., "Resonant Tunneling diode (RTD) structures," Rensselear Polytechnic Institute, 2003, pp. 1-14.
Siekkinen, et al., "Selective Epitaxial Growth Silicon Bipolar Transistors for Material Characterization," Electron Devices, IEEE Transactions on Electron Devices, vol. 35, No. 10, Oct. 1988, pp. 1640-1644.
Su et al., "Catalytic Growth of Group III-nitride Nanowires and Nanostructures by Metalorganic Chemical Vapor Deposition," Applied Physics Letters, vol. 86, 2005, pp. 013105-1-013105-3.
Su et al., "New Planar Self-Aligned Double-Gate Fully-depleted P-MOSFETs Using Epitaxial Lateral Overgrowth (ELO) and selectively grown source/drain (S/D)," 2000 IEEE Int'l. SOI Conf., pp. 110-111.
Suhara, et al, "Characterization of argon fast atom beam source and its application to the fabrication of resonant tunneling diodes," 2005 International Microprocesses and Nanotechnology Conf. Di. of Papers, 2005, pp. 132-133.
Sun et al. Electron resonant tunneling through InAs/GaAs quantum dots embedded in a Schottky diode with an AlAs insertion layer, 153 J. Electrochemical Society 153, 2006, pp. G703-G706.
Sun et al., "Room-temperature observation of electron resonant tunneling through InAs/AlAs quantum dots," 9 Electrochemical and Solid-State Letters 5, May 2006, pp. G167-G170.
Sun et al., "InGaAsP Multi-Quantum Wells at 1.5 /splmu/m Wavelength Grown on Indium Phosphide Templates on Silicon," Indium Phosphide and Related Materials, May 12-16, 2003, pp. 277-280.

(56) References Cited

OTHER PUBLICATIONS

Sun et al., "Selective Area Growth of InP on InP Precoated Silicon Substrate by Hydride Vapor Phase epitaxy," Indium Phosphide and Related Materials Conference, IPRM. 14th, 2002, pp. 339-342.
Sun et al., "Sulfur Doped Indium Phosphide on Silicon Substrate Grown by Epitaxial Lateral Overgrowth," Indium Phosphide and Related Materials 16th IPRM, May 31-Jun. 4, 2004, pp. 334-337.
Sun et al., "Temporally Resolved Growth of InP in the Opening Off-Oriented from [110] Direction," Idium Phosphide and Related Materials, Conference Proceedings, 2000 International Conference, pp. 227-230.
Sun et al., "Thermal Strain in Indium Phosphide on Silicon Obtained by Epitaxial Lateral Overgrowth," 94 Journal of Applied Physics 4, 2003, pp. 2746-2748.
Suryanarayanan et al., "Microstructure of Lateral Epitaxial Overgrown InAs on (100) GaAs Substrates," Applied Physics Letters, vol. 83, No. 10, Sep. 8, 2003, pp. 1977-1979.
Suzuki, et al., "Mutual injection locking between sub-THz oscillating resonant tunneling diodes," Japan Science and Technology Agency, IEEE, Joint 30th International Conference on Infrared and Millimeter Waves & 13th International Conference on Terahertz Electronics, 2005, pp. 150-151.
Takasuka et al., "AlGaAs/InGaAs DFB Laser by One-Time Selective MOCVD Growth on a Grating Substrate," 43 Japan, Journal of Applied Physics, 4B, 2004, pp. 2019-2022.
Takasuka et al., "InGaAs/AlGaAs Quantum Wire DFB Buried HeteroStructure Laser Diode by One-Time Selective MOCVD on Ridge Substrate," 44 Japan, Journal of Applied Physics, 4B, 2005, pp. 2546-2548.
Tamura et al., "Heteroepitaxy on High-Quality GaAs on Si for Optical Interconnections on Si Chip," Proceedings of the SPIE, vol. 2400, 1995, pp. 128-139.
Tamura et al., "Threading Dislocations in GaAs on Pre-patterned Si and in Post-patterned GaAs on Si," Journal of Crystal Growth, vol. 147, 1995, pp. 264-273.
Tanaka et al., "Structural Characterization of GaN Lateral Overgrown on a (111) Si Substrate," Applied Physics Letters, vol. 79, No. 7, Aug. 13, 2001, pp. 955-957.
Thean et al., "Uniaxial-Biaxial Hybridization for Super-Critical Strained-Si Directly on Insulator (SC-SSOI) PMOS with Different Channel Orientations," IEEE, 2005, pp. 1-4.
Thelander, et al., "Heterostructures incorporated in one-dimensional semiconductor materials and devices," Physics of Semiconductors, vol. 171, 2002, 1 page. Abstract Only.
Thompson et al., "A Logic Nanotechnology Featuring Strained-Silicon," 25 IEEE Electron Device Letters 4, 2004, pp. 191-193
Tomiya et al., "Dislocation Related Issues in the Degradation of GaN-Based Laser Diodes," Selected Topics in Quantum Electronics, IEEE Journal of Selected Topics in Quantum Electronics, vol. 10, No. 6, Nov./Dec. 2004, pp. 1277-1286.
Tomiya, "Dependency of crystallographic tilt and defect distribution of mask material in epitaxial lateral overgrown GaN layers," Applied Physics Letters vol. 77, No. 5, pp. 636-638.
Tran et al., "Growth and Characterization of InP on Silicon by MOCVD," Journal of Crystal Growth, vol. 121, 1992, pp. 365-372.
Tsai, et al., "InP/InGaAs resonant tunneling diode with six-route negative differential resistances," 13th European Gallium Arsenide and other Compound Semiconductors Application Symp., 2006, pp. 421-423.
Tsang et al., "The heteroepitaxial Ridge-Overgrown Distributed Feedback Laser," Quantum Electronics, IEEE Journal of Quantum Electronics, vol. 21, No. 6, Jun. 1985, pp. 519-526.
Tsaur, et al., "Low-Dislocation-Density GaAs epilayers Grown on Ge-Coated Si substrates by Means of Lateral Epitaxial Overgrowth," Applied Physics Letters, vol. 41, No. 15, Aug. 1982, pp. 347-349.
Tseng et al., "Effects of Isolation Materials on Facet Formation for Silicon Selective Epitaxial Growth," 71 Applied Physics Letters 16, 1997, pp. 2328.

Tsuji et al., Selective Epitaxial Growth of GaAs on Si with Strained Sort-period Superlattices by Molecular Beam Epitaxy under Atomic Hydrogen Irradiation, J. Vac. Sci. Technol. B, vol. 22, No. 3, May/Jun. 2004, pp. 1428-1431.
Ujiie, et al., Epitaxial Lateral Overgrowth of GaAs on a Si Substrate, 28, Japan, Journal of Applied Physics, vol. 3, Mar. 1989, pp. L337-L339.
Usuda et al., "Strain Relaxation of Strained-Si Layers on SiGe-on-Insulator (SGOI) Structures After Mesa Isolation," Applied Surface Science, vol. 224, 2004, pp. 113-116.
Usui et al., "Thick GaN Epitaxial Growth with Low Dislocation Density by Hydride Vapor Phase Epitaxy," vol. 36, Japan, Journal of Applied Physics, 1997, pp. L899-L902.
Vanamu et al., "Epitaxial Growth of High-Quality Ge Films on Nanostructured Silicon Substrates," Applied Physics Letters, vol. 88, 2006, pp. 204104.1-204-104.3.
Vanamu et al., "Growth of High Quality Ge/$Si_{1-x}Ge_x$ on Nano-scale Patterned Si Structures," J. Vac. Sci. Technology. B, vol. 23, No. 4, Jul./Aug. 2005, pp. 1622-1629.
Vanamu et al., "Heteroepitaxial Growth on Microscale Patterned Silicon Structures," Journal of Crystal Growth, vol. 280, 2005, pp. 66-74.
Vanamu et al., "Improving Ge $Si_xGe_{1-x}$ Film Quality through Growth onto Patterned Silicon Substrates," Advances in Electronics Manufacturing Technology, Nov. 8, 2004, pp. 1-4.
Vescan et al., "Lateral Confinement by Low Pressure Chemical Vapor Deposition-Based Selective Epitaxial Growth of $Si_{1-x}Ge_x$/Si Nanostructures," No. 81, Journal of Applied Physics 10, 1997, pp. 6709-6715.
Vetury et al., "First Demonstration of AlGaN/GaN Heterostructure Field Effect Transistor on GaN Grown by Lateral Epitaxial Overgrowth (ELO)," Inst. Phys. Conf. U.S. Appl. No. 162: Ch. 5, Oct. 1998, pp. 177-183.
Walker, et al., "Magnetotunneling spectroscopy of ring-shaped (InGa)As quantum dots: Evidence of excited states with 2pz character," 32 Physica E 1-2, May 2006, pp. 57-60.
Wang et al, "Fabrication of Patterned Sapphire Substrate by Wet Chemical Etching for Maskless Lateral Overgrowth of GaN," Journal of Electrochemical Society, vol. 153, No. 3, Mar. 2006, pp. C182-C185.
Ting, et al., "Modeling Spin-Dependent Transport in InAS/GaSb/AlSb Resonant Tunneling Structures," 1 J. Computational Electronics, 2002, pp. 147-151.
Watanabe, et al., "Fluoride resonant tunneling diodes on Si substrates," IEEE International Semiconductor Device Research Symp. Dec. 2005, pp. 177-178.
Wernersson et al., "InAs Epitaxial Lateral Growth of W Marks," Journal of Crystal Growth, vol. 280, 2005, pp. 81-86.
Williams et al., "Etch Rates for Micromachining Processing—Part II," Journal of Microelectromechanical Systems, vol. 4, 1996, pp. 761-778.
Williams et al., "Etch Rates for Micromachining Processing—Part II," Journal of Microelectromechnical Systems, vol. 5, No. 4, Dec. 1996, pp. 256-269.
Wu et al., "Enhancement-mode InP n-channel metal-oxide-semiconductor field-effect-transistors with atomic-layer-deposited Al2O3 dielectrics," Applied Physics Letters 91, 022108-022110 (2007).
Wu et al., Gross-Sectional Scanning/Tunneling Microscopy Investigations of Cleaned III-V Heterostructures, Technical report, Dec. 1996, 7 pages.
Wu et al., "Inversion-type enhancement-mode InP MOSFETs with ALD Al2O3, HfAlO nanolaminates as high-k gate dielectrics," Proceedings of the 65th Device Research Conf., 2007, pp. 49-52.
Wuu et al., "Defect Reduction and Efficiency Improvement of Near-Ultraviolet Emitters via Laterally Overgrown GaN on a GaN/Patterned Sapphire Template," Applied Physics Letters, vol. 89, No. 16, Oct. 16, 2006, pp. 161105-1-161105-1-3.
Xie et al., "From Porous Si to Patterned Si Substrate: Can Misfit Strain Energy in a Continuous Heteroepitaxial Film Be Reduced?" Journal of Vacuum Science Technology, B, vol. 8, No. 2, Mar./Apr. 1990, pp. 227-231.

(56) References Cited

OTHER PUBLICATIONS

Xu et al., "Spin-Filter Devices Based on Resonant Tunneling Antisymmetrical Magnetic Semiconductor Hybrid Structures," vol. 84, Applied Physics Letters 11, 2004, pp. 1955-1957.

Yamaguchi et al., "Analysis for Dislocation Density Reduction in Selective Area Growth GaAs Films on Si Substrates," Applied Physics Letters, vol. 56, No. 1, Jan. 1, 1990, pp. 27-29.

Yamaguchi et al., "Defect Reduction Effects in GaAs on Si Substrates by Thermal Annealing," Applied Physics Letters vol. 53, No. 23, 1998, pp. 2293.

Yamaguchi et al., GaAs Solar Cells Grown on Si Substrates for Space Use: Prog. Photovolt.: Res. Appl., vol. 9, 2001; pp. 191-201.

Yamaguchi et al., "Super-High-Efficiency Multi-junction Solar Cells," Prog. Photovolt.: Res. Appl., vol. 13, 2005, pp. 125-132.

Yamamoto et al., "Optimization of InP/Si Heteroepitaxial Growth Conditions Using Organometallic Vapor Phase Epitaxy," Journal of Crystal Growth, vol. 96, 1989, pp. 369-377.

Yang et al., "High Performance CMOS Fabricated on Hybrid Substrate with Different Crystal Orientations," IEDM Tech. Dig., 2003, pp. 453-456.

Yang et al., "Selective Area Deposited Blue GaN-InGaN Multiple-quantum Well Light Emitting Diodes over Silicon Substrates," Applied Physics Letter, vol. 76, No. 3, Jan. 17, 2000, pp. 273-275.

Yili, et al., "Physics-based hydrodynamic simulation of direct current characteristics in DBRTD," 29 Chinese J. Electron Devices 2, Jun. 2006, pp. 365-368.

Yin et al., "Ultrathin Strained-SOI by Stress Balance on Compliant Substrates and FET Performance," 52 IEEE Trans. on Electron Devices 10, 2005, pp. 2207-2214.

Dong et al., "Selective area growth of InP through narrow openings by MOCVD and its application to inP HBT," Indium Phosphide and Related Materials, International Conference, May 12-16, 2003, pp. 389-392.

Yoon et al., "Selective Growth of Ge Islands on Nanometer-scale Patterned $SiO_2$/Si Substrate by Molecular Beam Epitaxy," Applied Physics Letters, vol. 89, 2006, pp. 063107.1-063107.3.

Yoshizawa et al., "Growth of self-Organized GaN Nanostructures on $Al_2O_3$ (0001) by RF-Radial Source Molecular Beam Epitaxy", Japan, Journal of Applied Physics, Part 2, vol. 36, No. 4B, 1997, pp. L459-L462.

Zamir et al., Thermal Microcrack Distribution Control in GaN Layers on Si Substrates by Lateral Confined Epitaxy, Applied Physics Letters, vol. 78, No. 3, Jan. 15, 2001, pp. 288-290.

Zang et al., "Nanoheteroepitaxial lateral overgrowth of GaN on nanoporous Si (111)," Applied Physics Letters, vol. 88, No. 14, Apr. 3, 2006, pp. 141925.

Zang et al., "Nanoscale lateral epitaxial overgrowth of GaN on Si (111)," Applied Physics Letters, vol. 87, No. 19 (Nov. 7, 2005) pp. 193106.1-193106.3.

Zela et al., "Single-crystalline Ge Grown Epitaxially on Oxidized and Reduced Ge/Si (100) Islands," Journal of Crystal Growth, vol. 263, 2004, pp. 90-93.

Zhang et al., "Removal of Threading Dislocations from Patterned Heteroepitaxial Semiconductors by Glide to Sidewalls," Journal of Electronic Materials, vol. 27, No. 11, 1998, pp. 1248-1253.

Zhang et al., "Strain Status of Self-Assembled InAs Quantum Dots," Applied Physics Letters, vol. 77, No. 9, Aug. 28, 2000, pp. 1295-1297.

Zheleva et al., "Lateral Epitaxy and Dislocation Density Reduction in Selectively Grown GaN Structures," Journal of Crystal Growth, vol. 222, No. 4, Feb. 4, 2001, pp. 706-718.

Zubia et al., "Initial Nanoheteroepitaxial Growth of GaAs on Si (100) by OMVPE," Journal of Electronic Materials, vol. 30, No. 7, 2001, pp. 812-816.

\* cited by examiner

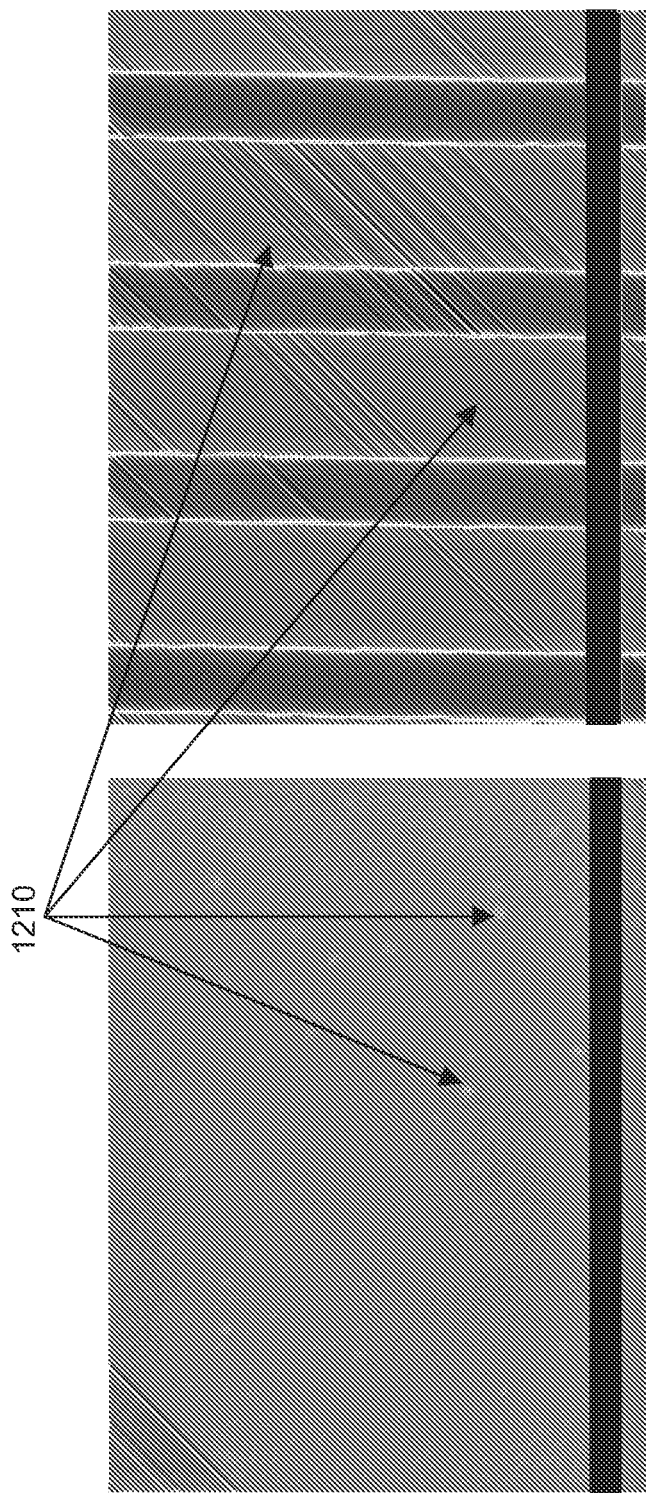

POLISHING OF SMALL COMPOSITE SEMICONDUCTOR MATERIALS

RELATED APPLICATIONS

This application is a divisional of U.S. patent application Ser. No. 12/503,597, filed Jul. 15, 2009, entitled "POLISHING OF SMALL COMPOSITE SEMICONDUCTOR MATERIALS," which application claims the benefit of and priority to U.S. Provisional Application No. 61/080,779, filed Jul. 15, 2008, entitled "POLISHING OF SMALL COMPOSITE SEMICONDUCTOR MATERIALS", the disclosures of which are hereby incorporated by reference in their entireties.

BACKGROUND OF THE INVENTION

1. Field of the Invention

The present invention relates to planarization for semiconductor structures or device fabrication.

2. Description of the Related Art

This section provides background information and introduces information related to various aspects of the disclosure that are described and/or claimed below. These background statements are not admissions of prior art.

Integration of lattice-mismatched semiconductor materials is one path to high performance devices such as complementary metal-oxide-semiconductor (CMOS) field-effect transistors (FET) due to their high carrier mobility. For example, the heterointegration of lattice-mismatched semiconductor materials with silicon will be useful for a wide variety of device applications. One heterointegration method involves creation of confined regions of lattice-mismatched semiconductor materials on a silicon substrate. However, planarization is typically required for device fabrication. Chemical mechanical polishing (CMP) of the selected lattice-mismatched semiconductor materials is an option to smooth the surface of the material. Low material removal rates are needed, and creation of dishing or surface impurities must be avoided. Thus, there exists a need to planarize a surface of lattice-mismatched materials in a confined or selectively grown area (e.g., an active region of crystalline materials).

SUMMARY OF THE INVENTION

Embodiments according to the present invention provide compositions, methods and apparatus to planarize confined mismatched material suitable for device fabrication and/or devices made thereby.

In one aspect, one embodiment of the invention can provide planarized regions (e.g., wafers) with reduced or minimal dishing and/or overpolish of the heteroepitaxial regions.

In another aspect, one embodiment of the invention is to provide planarized regions with reduced or low levels of metallic contamination.

An aspect of one embodiment of the invention is to provide a lattice-mismatched crystalline material with a reduced surface roughness.

In yet another aspect, an embodiment of a CMP process can planarize confined mismatched crystalline material (e.g., by an insulator) suitable for device fabrication.

In yet another aspect of the invention, compositions such as slurries provide polish selectivity for heteroepitaxial regions or materials relative to the confining regions or insulators.

In yet another aspect, an embodiment of a CMP process can planarize a Ge—$SiO_2$ composite structure produced by Ge growth in $SiO_2$ trenches on a Si wafer.

In an alternative aspect, one embodiment the invention is provided to planarize a crystalline material/insulator combination.

In yet another aspect of the invention, planarized heteroepitaxial regions are selected to provide designated characteristics corresponding to a resulting device.

These aspects may be especially applicable to devices incorporating ART techniques, including but not limited to a mixed signal application device, a field effect transistor, a quantum tunneling device, a light emitting diode, a laser diode, a resonant tunneling diode and a photovoltaic device. The ART devices may have crystalline material epitaxially grown in openings or confined areas with an aspect ratio (depth/width)>1, or otherwise suitable for trapping most defects.

Additional aspects and utilities of the invention will be set forth in part in the description which follows and, in part, will be obvious from the description, or may be learned by practice of the invention.

BRIEF DESCRIPTION OF THE DRAWINGS

These and/or other aspects and utilities of the present general inventive concept will become apparent and more readily appreciated from the following description of the embodiments, taken in conjunction with the accompanying drawings, of which:

FIG. 11 comprising

FIG. 12 comprising FIGS. 12(a)-12(b) illustrate pitting observed in plan-view SEM for (a) a Ge blanket film that was polished with 10% $H_2O_2$ in a slurry mix and (b) an overpolished Ge ART sample that was polished with 5% $H_2O_2$ in a slurry mix.

FIG. 14 comprising

DETAILED DESCRIPTION OF THE PREFERRED EMBODIMENTS

Figures 1A, 1B:
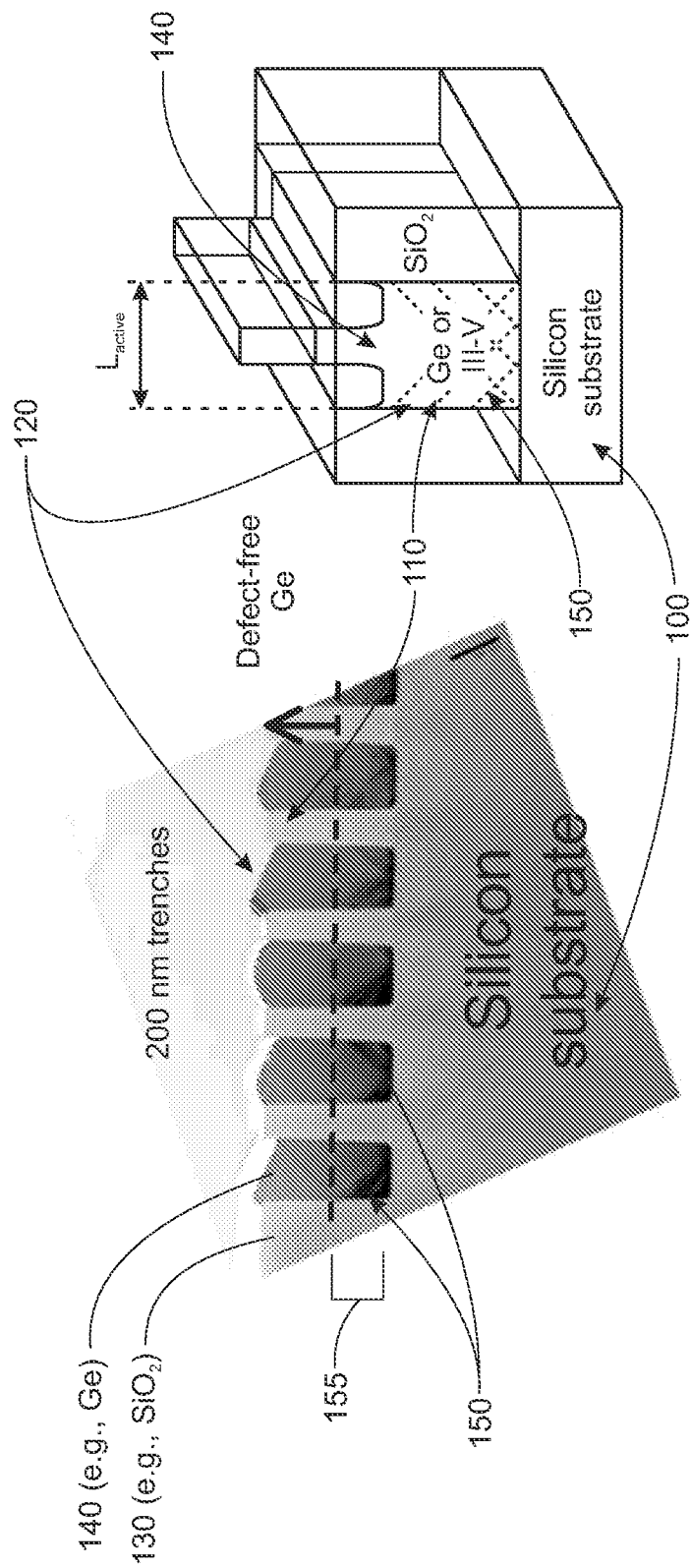
FIG. 1, comprising FIGS. 1(a)-1(c), respectively illustrate (a) cross-sectional TEM image of defect trapping in ART structure (e.g., 200 nm trenches of Ge) where a lattice-mismatched material region above the dashed line has reduced defects, (b) schematic of proposed device structure showing trapped defects, and (c) an alternate configuration (e.g., confined area for crystalline material) of an ART structure.

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

The formation of lattice-mismatched materials has many practical applications. For example, heteroepitaxial growth of group IV materials or compounds, and III-V, III-N and II-VI compounds on a crystalline substrate, such as silicon, has many applications such as photovoltaics, resonant tunneling diodes (RTD's), transistors (e.g., FET (which can be planar or 3D (e.g., finFET), HEMT, etc.), light-emitting diodes and laser diodes. As one example, heteroepitaxy of germanium on silicon is considered a promising path for high performance p-channel metal-oxide-semiconductor (MOS) field-effect transistors (FET) and for integrating optoelectronic devices with silicon complementary MOS (CMOS) technology. Heteroepitaxy growth of other materials (e.g., of group III-V, III-N and II-VI compounds and other group IV materials or compounds) also is beneficial for these and other applications.

However, the dislocation density of the epitaxially grown material can be unacceptably high for many applications. For example, the dislocation density of germanium directly grown on silicon can be as high as $10^8$-$10^9$ cm$^{-2}$ due to the 4.2% lattice mismatch between the two materials—unacceptable for most device applications. Various approaches to reducing the defect density have been pursued, including compositional grading, and post-epi high-temperature annealing. However, these approaches may not be optimal for integration with silicon-based CMOS technology due to requirements for thick epi-layers and/or high thermal budgets, or due to incompatibility with selective growth at a density suitable for CMOS integration.

Aspect Ratio Trapping (ART) is a defect reduction technique that mitigates these problems. As used herein, "ART" or "aspect ratio trapping" refers generally to the technique(s) of causing defects to terminate at non-crystalline, e.g., dielectric, sidewalls, where the sidewalls are sufficiently high relative to the size of the growth area so as to trap most, if not all, of the defects. ART utilizes high aspect ratio openings, such as trenches or holes, to trap dislocations, preventing them from reaching the epitaxial film surface, and greatly reduces the surface dislocation density within the ART opening.

FIG. 1a shows a cross section of a lattice-mismatched material 140 of high quality above a defect region 155 using ART. As illustrated here, a crystalline material 140 is epitaxially grown on substrate 100 (here, for example, on the (001) surface of a silicon substrate). By confining the crystalline growth within an opening 120 (e.g., trench, recess or the like) with a sufficiently high aspect ratio (e.g., 1 or greater, 0.5 or greater), defects 150 formed while epitaxially growing the crystalline material 140 travel to and end at the sidewalls (e.g., insulator sidewalls) 110. Thus, the crystalline material 140 continues to grow without the continued growth of the defects 150, thereby producing crystal with reduced defects. This technique has been shown to be effective for growing low defectivity materials such as Ge, InP and GaAs selectively on Si in trenches 200-450 nm wide and of arbitrary length—an area large enough for devices such as a FET, for example. Such trenches can be wider or narrower.

An embodiment of the invention is directed to a device including a planarized lattice-mismatched material in an opening in an insulator. FIG. 1b shows one example, illustrating a perspective view of a portion of an exemplary device. As shown in FIG. 1b, the example includes a crystalline material 140 grown on a substrate 100 in an opening 120 defined in an insulator 130 for a non-Si channel MOSFET. The substrate 100 may be a crystalline material such as silicon, Ge or sapphire. Insulator 130 is preferably a non-crystalline material such as a dielectric material including silicon nitride or $SiO_2$. The crystalline material 140 at least at some stage has a surface above the top surface of insulator 130. A planarized surface can include at least a surface of portions of the crystalline material 140 corresponding to source, drain and gate regions of the device.

In one example, the width of the opening 120 may be 400 nm or less, 350 nm or less, 200 nm or less, 100 nm or less or 50 nm or less; these sizes have been shown to be effective for ART (of course these sizes do not need to be used with ART). Alternatively, the width of the opening may be 5 µm or less. In another alternative, the width of the opening may be 1 µm or less. The opening may be formed as a trench (with the length of the trench running front to back as shown in FIG. 1b) in which case the width would be considered to be perpendicular to its length and height. The length of the trench may be arbitrary. Alternatively, the length of the trench may be substantially larger than the width of the trench, for example greater than 10 times larger, or greater than 100 times larger. In one example, the length of the trench is 2 µm.

It is preferred, but not necessary, that the opening 120 is used to trap defects when epitaxially growing the crystalline material 140 using ART (aspect ratio trapping) techniques. (Aspect ratio "AR" is defined for trenches as the ratio of the trench height/trench width.) In such a case, the aspect ratio may be greater than 1, although it possible for the aspect ratio to be lower in ART devices, for example 0.5. In one embodiment, the crystalline material 140 can include two different semiconductor materials or more than one semiconductor material (e.g., GaAs/InP/InGaAs) such as or first, second and third materials where the first material can be Ge or GaAs, can be less than 100 nm or can have bonding characteristics to a substrate and the third material is polished. Further details of example ART devices and ART techniques in which this invention may be incorporated may be found in U.S. patent application Ser. No. 11/436,198 filed May 17, 2006, Ser. No. 11/493,365 filed Jul. 26, 2006 and Ser. No. 11/852,078 filed Sep. 7, 2007, all of which are hereby incorporated by reference.

The substrate 100 in the above examples may include a group IV element or compound, such as germanium and/or silicon, e.g., (001) silicon. The crystalline material 140 may include at least one of a group IV element or compound, a III-V or III-N compound, or a II-VI compound. Examples of group IV elements include Ge, Si and examples of group IV compounds include SiGe. Examples of III-V compounds include aluminum phosphide (AlP), gallium phosphide (GaP), indium phosphide (InP), aluminum arsenide (AlAs), gallium arsenide (GaAs), indium arsenide (InAs), aluminum antimonide (AlSb), gallium antimonide (GaSb), indium antimonide (InSb), and their ternary and quaternary compounds. Examples of III-N compounds include aluminum nitride (AlN), gallium nitride (GaN), indium nitride (InN), and their ternary and quaternary compounds. Examples of II-VI compounds includes zinc selenide (ZnSe), zinc telluride (ZnTe), cadmium selenide (CdSe), cadmium telluride (CdTe), zinc sulfide (ZnS), and their ternary and quaternary compounds.

Figure 1C:
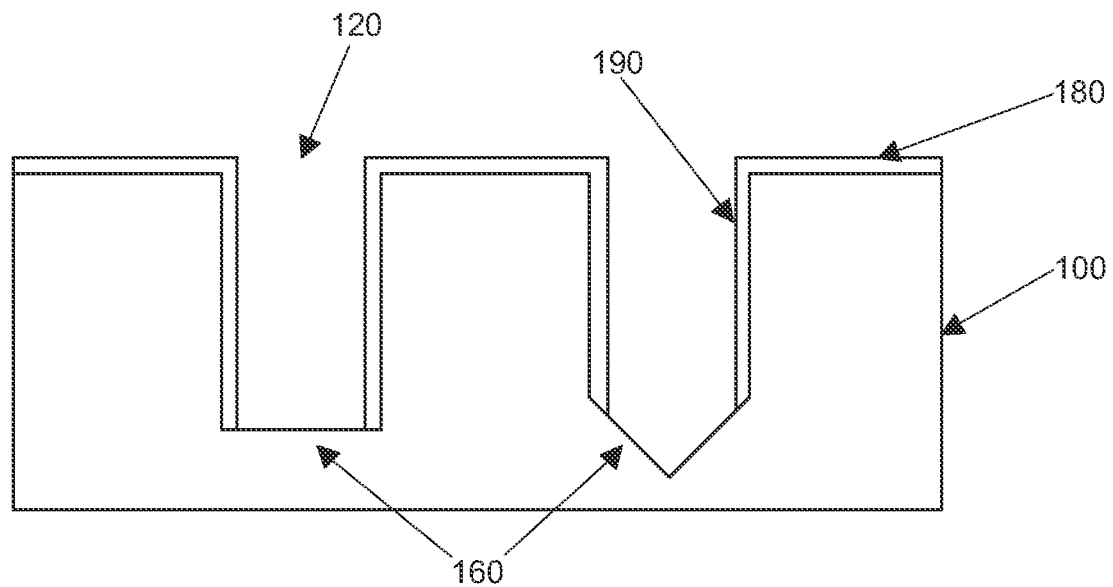

The layer of insulator need not be formed as a substantially planar layer. For example, the insulator may be formed of a thin layer that conforms to an undulating surface of the substrate on which it is created. FIG. 1c illustrates an example including a substrate that has openings/recesses/trenches 120 etched into the substrate 100. An insulating layer 180 has been formed across the substrate 100 conforming to the surface topography of the etched substrate 100. The insulating layer 180 is configured at the bottom of the openings/trenches to expose portions 160 of the substrate 100 for subsequent lattice-mismatched crystalline material. In this case, sidewalls of the insulator 190 can be formed by deposition on or oxidation of the substrate 100 and are not formed by a separate photolithography process. Exemplary configurations of the trenches 120 and portions 160 are illustrated however, embodiments of the invention are not intended to be so limited, for example, as other linear, tiered or nonlinear cross-sections may be used for the trenches 120 and the portions 160.

The following description in connection with FIGS. 2-15 describes examples of how surfaces of the lattice-mismatched semiconductor material or crystalline material within a confined space (e.g., crystalline material 140 within insulator 130) may be planarized or provided with a prescribed surface smoothness. Although this description is in connection with specific materials and process parameters, it will be apparent that the description is exemplary only, and should not be considered to limit embodiments of the invention to such materials and process parameters.

Exemplary CMP embodiments according to the invention for planarizing Ge—$SiO_2$ composite structures produced by Ge growth in $SiO_2$ trenches on a Si wafer will now be described. Embodiments of CMP processes can produce flat and/or co-planar planarized regions (e.g., Ge regions or Ge/insulator regions) suitable for device fabrication including reduced roughness, low dishing and/or overpolish of such regions and low levels of contamination. A slurry mix can include part abrasive, part chemical additive, and the remaining liquid or de-ionized (DI) water, adding up to 100% of the slurry mix. In one embodiment, the addition of $H_2O_2$ to a diluted colloidal slurry was determined to provide desired results including selectivity, step height, reduced surface roughness and low resulting contaminants in composite structures.

The following materials and process parameters were used for Ge grown as discussed in connection with FIGS. 2-15. The starting substrates used in this work were crystalline silicon, 200 mm diameter, p-type, and (001) oriented. A 500-nm-thick thermal oxide was grown on the substrate. The oxide layer was patterned into trenches along [110] direction of the silicon substrate having 180-350 nm width and 13 mm length. The trenches were formed using conventional photolithography techniques and a reactive ion etching (RIE) step. The patterned substrates were then cleaned in Pirana, SC2, and dilute HF solutions sequentially. Removal of fluorocarbon residues caused by RIE was accomplished using a 25-nm-thick sacrificial oxidation and subsequent HF oxide etch. The final trench height was 490 nm after this cleaning procedure. Undoped Ge layers were selectively, epitaxially grown by chemical vapor deposition (CVD) on the exposed Si substrate (either in the trenches or on a blanket Si substrate (e.g., a bare Si wafer)) in an industrial ASM Epsilon E2000 system. This CVD system is a horizontal, cold-wall, single wafer, load-locked reactor with a lamp-heated graphite susceptor in a quartz tube. Directly prior to growth, the substrates were cleaned in a diluted HF solution and rinsed in DI (deionized) water. The substrates were loaded into the growth chamber and baked in $H_2$ for 1 minute at 870° C. The pressure during the bake was set the same value as used in the subsequent growth step, 80 Torr. The growth step used a 30 sccm germane ($GeH_4$) source gas flow diluted to 25% in a 20 slm hydrogen carrier gas flow. The Ge growth was performed in two steps; the first step is at 400° C. for 540 sec and the second step is at 600° C. for a time period of 1200-7000 sec. Selected samples for CMP were uncoalesced, while other samples were grown to coalescence above the oxide trenches.

Experimental Results

For the experimental results described below, CMP was performed on these 200 mm wafers on either a Strasbaugh 6EC or an IPEC 472 CMP tool with a spiral k-groove IC1000-Suba IV stacked pad, a 3M S60 diamond conditioner, and variable concentrations of Nalco 2360 slurry (70 nm colloidal silica). Nalco 2360 slurry is a commercially available colloidal silica polishing slurry having submicron silica particles in an aqueous solution. Either 6% NaOCl, 30% NH4OH, or 30% H2O2 solution was added to the diluted slurry to enhance the Ge removal rate. Thus, each slurry mix consisted of part Nalco 2360, part chemical additive, and the remainder was deionized water (DI) water, adding up to 100% of the slurry mix. Concentration percentages listed beyond this point refer to the fraction of Nalco 2360, NaOCl solution, NH4OH solution, H2O2 solution, or DI water in the slurry mix. Exemplary concentration ranges of the chemicals tested in the slurry mix were 0-2.4% of NaOCl, 0-100% NH4OH, and O-10% H2O2. Polish conditions for the Strasbaugh 6EC tool follow. Before CMP, the pad break-in is accomplished with 5 lbs applied, 50 rpm conditioner speed, 65 rpm table speed, 200 mL/min of DI water, 25 sweeps of the conditioner arm (back and forth), and 36 seconds/complete sweep. A precondition step was used to spread slurry over the table at the beginning of each run, using parameters 5 lbs applied, 150 mL/min of slurry mix, 20 rpm conditioner speed, 20 rpm table speed, 2-5 center-to-edge sweeps, and 11 seconds/partial sweep. The CMP process included 10 seconds of ramp-up, a polish step, and 25 seconds of ramp-down and rinse steps. Polishing time for the polish step was varied, and in-situ sweep pad conditioning of 5 lbs (22 sec/complete sweep) was used throughout the CMP process. The down-force during the polish step was 3 PSI, slurry feed rate 150 mL/min, table speed 45 rpm, and wafer chuck speed 41 rpm. Automatic hydro-load and polish were used for all samples, and back pressure and ring force were optimized as needed. The table is cooled by building cooling water, and table temperature varied between 60-85° F. during polishing. Wafers polished with the IPEC 472 CMP tool used similar conditions.

The post-CMP clean, using the Verteq Goldfinger single-wafer megasonic post-CMP tool, consisted of a contamination spin-off, 60 sec process time, 30 sec rinse time, and 30 sec spin dry time. Megasonic power of 125 W was used for all samples. Only DI water (1.7-3 L/min) was used for most Ge and Ge ART samples, while a diluted standard clean 1 (SC-1) solution was used in the megasonic clean for all wafers with an oxide film. The concentration of the SC-1 solution was 50 mL/min NH4OH (30%) and 100 mL/min H2O2 (30%) in 1.7-3 L/min of DI water. Wafers which were polished on the IPEC 472 CMP were cleaned using an OnTrak brush scrubber.

Evaluation of the material removal rate (RR) was based on CMP of blanket oxide and Ge films on Si. Pre-CMP and post-CMP film thicknesses were measured by interferometry (Filmetrics) or ellipsometry (Sopra). Endpointing of the patterned ART samples was achieved initially by visual and optical microscope inspection, and later by calibrating CMP process time with cross-sectional scanning electron microscope (SEM) analysis. However, alternative known endpointing techniques may be used. The patterned sample thicknesses after polishing were measured in an Amray 3300FE or Zeiss Supra 40 field-emission SEM. Transmission electron microscopy (TEM) samples, prepared by mechanical polishing and Ar ion milling, were observed in a JEOL JEM 2100 TEM. VPD-ICP-MS was used to measure the level of metallic contamination on the surface of bare silicon or blanket oxide wafers after CMP.

Experimental slurry investigation included slurry mixtures of diluted Nalco 2360 alone and respectively combined with either NaOCl, NH$_4$OH, or H$_2$O$_2$ tested for suitability for CMP of Ge (e.g., confined Ge). Results for each slurry mixture are described separately first; followed by combined selectivity and metals data. Factors analyzed can include at least selectivity, removal rate, and planarized surface characteristics such as smoothness, dishing, overpolish, step height and post-CMP surface metallic contamination levels. One preferred polishing rate ratio (selectivity) is Ge faster than SiO$_2$ or Ge:SiO$_2$ selectivity at least >1:1. Another preferred target Ge:SiO$_2$ selectivity was about 1-10:1. Another preferred target Ge:SiO$_2$ selectivity was about 3-5:1.

Figure 2:
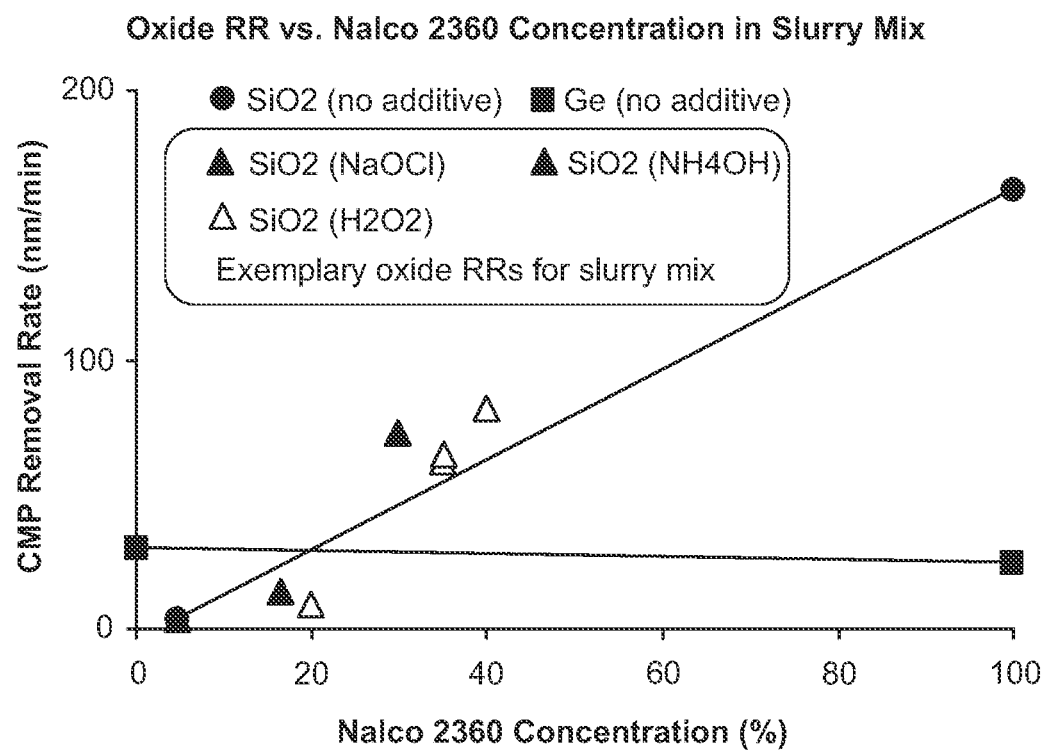
FIG. 2 illustrates exemplary oxide removal rates as a function of slurry concentration, oxide removal rates for slurry mix with various chemical additive conditions, and Ge removal rates as a function of slurry concentration using no additives.

As shown in FIG. 2, the removal rate of diluted Nalco 2360 slurry was tested. Wafers were polished with Nalco 2360 slurry diluted with de-ionized (DI) water. The CMP removal rates were determined for slurry mixtures with concentrations of Nalco 2360 varying from 4.5% to 100%. FIG. 2 illustrates oxide SiO$_2$ removal rates as a function of slurry concentration and for various chemical additives.

Ge polished using no additives is illustrated in FIG. 2 for comparison to diluted Nalco 2360 slurry in the slurry mix. FIG. 2 illustrates exemplary Ge RR data at 100% and 0% Nalco 2360. As shown in FIG. 2, the Nalco 2360 concentration alone does not significantly affect the Ge polish rate 220, but oxide RR 210 is directly related to the amount of Nalco 2360 in the slurry mix.

Exemplary results for oxide RR 210 using slurry and oxide RR using slurry with additives indicate Nalco 2360 concentration is the major factor controlling the oxide RR in all slurry mixes. While the oxide removal rates for wafers polished with additives appear to have some effect on the oxide RR as shown in FIG. 2, the effect appears to follow the same general trend as a slurry mix without additives, at least for the concentrations tested. Thus, Nalco 2360 concentration is the major factor controlling the oxide RR. Using diluted slurry alone, the preferred selectivity of Ge faster than SiO$_2$ was not achievable for any concentrations because of vibration (described below).

The Nalco 2360 slurry chosen for testing was intended to be selective in polishing Ge rather than SiO$_2$. As shown in FIG. 2, an increasing oxide RR and a relatively constant Ge RR can result in selectivity >1 for Ge:SiO$_2$ at low concentrations of slurry (e.g., a slurry mix with approximately <20% slurry). An unexpected result of the Nalco 2360 choice was significant CMP tool vibration when polishing oxide wafers with slurry mixes containing low concentrations of Nalco 2360 in DI water. A slurry mix containing below approximately 35% Nalco 2360 slurry generated debilitating vibration of the CMP tool and experimentally a preferred selectivity of Ge removal faster than SiO$_2$ was not achievable.

Although the Nalco 2360 slurry was successfully used experimentally, embodiments of the invention are not intended to be so limited. For example, particle size can range between 20-90 nm, 50-90 nm or 50-70 nm may be used. Such particles may be spherical. Thus, colloidal or fumed slurry may be used. In addition, embodiments of a slurry mix can operate with a pH range between 7-10, however, any pH sufficient for particles to remain in suspension in a slurry mix can be used. Further, although colloidal silica particles were used experimentally, alternative materials for slurry particles (e.g., abrasives) can include ceria (e.g., CeO$_2$) or alumina (e.g., Al$_2$O$_3$). Alternative slurry mix can use particles of similar size. Although these do not oxidize semiconductor crystalline materials (e.g., Ge) during CMP as silica does, the functional operation of an abrasive can be sufficient in embodiments of a slurry mix according to the invention. According to one embodiment, semiconductor crystalline materials that exhibit water soluble oxidation can enhance polishing characteristics of a CMP process. Exemplary slurry mix according to one embodiment is preferred to not significantly polish or not to polish the insulator (e.g., dielectric, silicon nitride or SiO$_2$) confining the lattice-mismatched semiconductor crystalline materials. Thus, in one embodiment, a slurry mix with diluted Nalco 2360 achieved oxide RR below 70 nm/minute without CMP tool vibration. According to one embodiment, a lubricant can be used to reduce vibration during CMP, however, consideration (e.g., additional cleaning procedures) should be made to reduce contaminants that can be added by exemplary lubricants.

Figure 3:
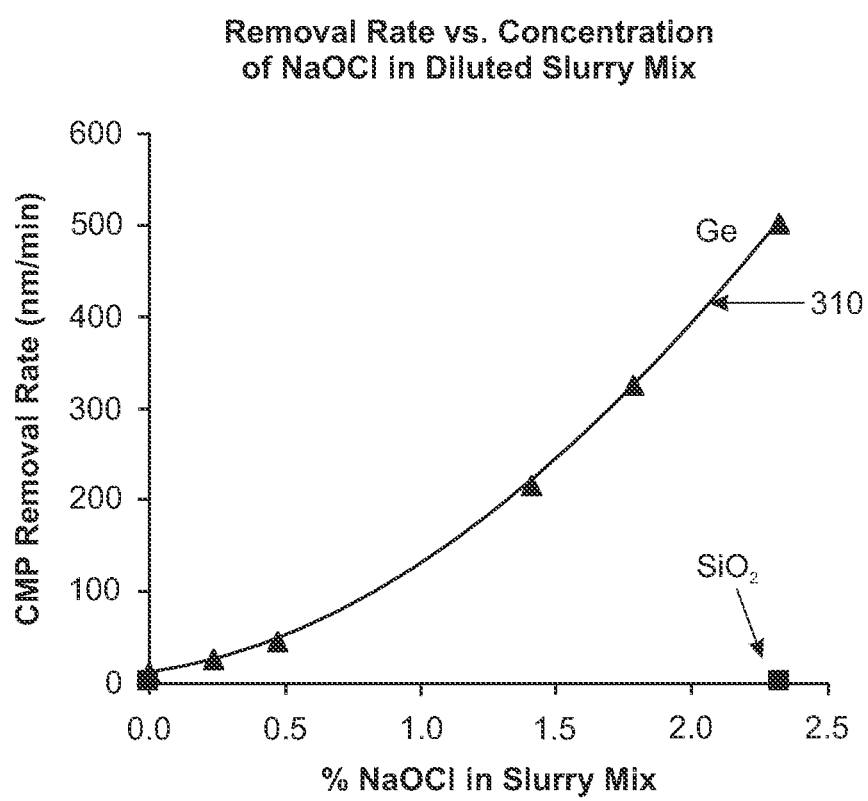
FIG. 3 illustrates Ge and $SiO_2$ removal rates determined for slurry mixes containing NaOCl additive at low Nalco 2360 concentrations.

FIG. 3 illustrates exemplary Ge and SiO$_2$ removal rates determined for slurry mixes containing NaOCl additives at low Nalco 2360 concentrations. The incorporation of up to 2.4% NaOCl in the diluted Nalco 2360 slurry mix increases the Ge RR 310, as shown in FIG. 3. The NaOCl-additive experiments were run at ~4.5% Nalco 2360 and the tool vibration was not observed. Tool vibration was not observed while using NaOCl in the slurry mix.

Although vibrations were not observed during CMP testing with NaOCl additives, significant vibrations were seen upon switching to NH$_4$OH and H$_2$O$_2$ additives. These vibrations are believed to be caused by high levels of friction between the wafer and the pad for some slurry mixtures. In addition, the vibrations were evident only when polishing oxide films, and not when polishing Ge films.

NaOCl is believed to act as an additional lubricant at the wafer-pad interface, while the NH$_4$OH and H$_2$O$_2$ do not. Experimentally, minimum Nalco 2360 concentrations of 30-35% were necessary to eliminate vibrations using NH$_4$OH and $H_2O_2$ additives. Such vibrations prevented CMP testing the $SiO_2$ polish rate for low Nalco 2360 concentrations, and also in slurry mixes containing $NH_4OH$ and $H_2O_2$ additives. Additional spherical colloidal silica particles in the slurry mix appear to moderate the friction at the oxide-CMP pad interface.

Figure 4:
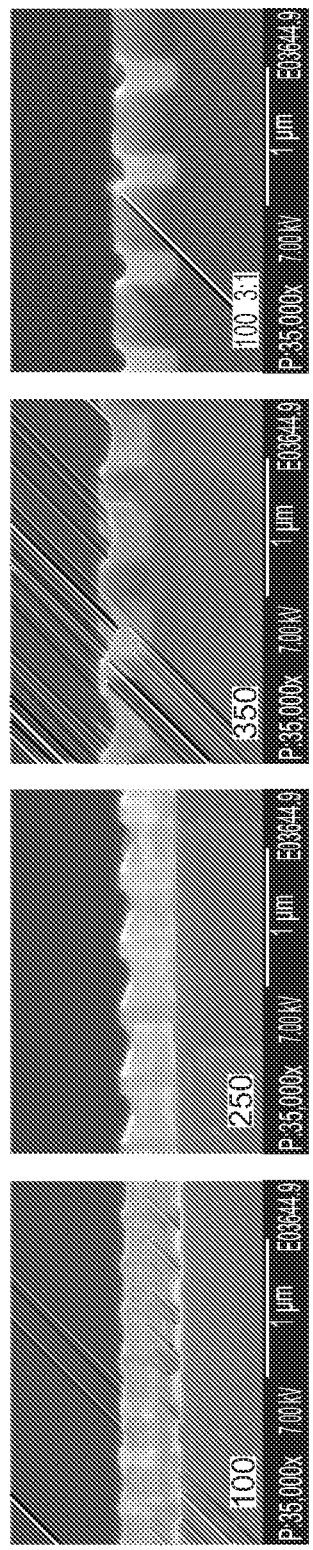
FIG. 4 illustrates cross-sectional SEM images of Ge ART sections of different trench widths polished with 1.4% NaOCl and 4.7% Nalco 2360 in the slurry mix.

FIG. 4 illustrates exemplary results using cross-sectional SEM images of Ge ART sections of different trench widths polished with 1.4% NaOCl and 4.7% Nalco 2360 in the slurry mix. As shown in FIG. 4, the trench widths vary from approximately 200 nm to 400 nm. Cross-sectional SEM results in FIG. 4 illustrate significant dishing at 1.4% NaOCl. While overpolish is evident in FIG. 4 as well, the level of dishing on this sample is unacceptably high (e.g., for device fabrication).

Figure 5:
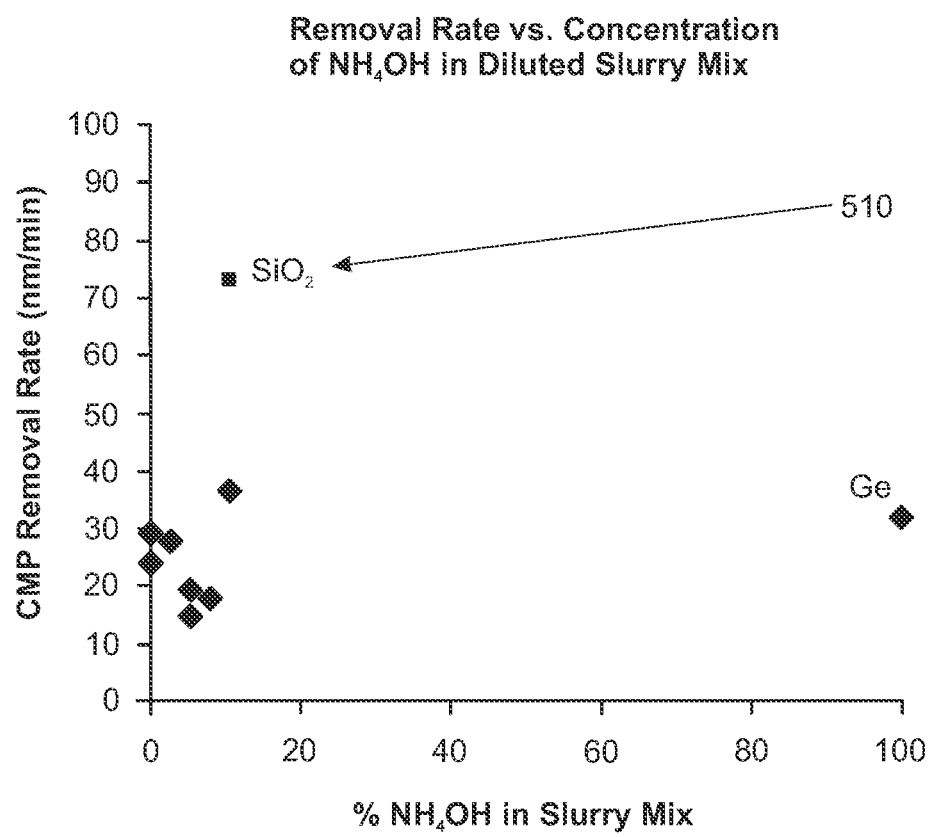
FIG. 5 illustrates Ge removal rates determined for slurry mixes containing $NH_4OH$ additive. Minimum oxide polish rate indicated.

FIG. 5 illustrates exemplary Ge removal rates determined for slurry mixes containing $NH_4OH$ additives. As shown in FIG. 5, the slurry mixes containing $NH_4OH$ additives were experimentally tested at a minimum oxide ($SiO_2$) removal rate of 70 nm/min 510 at 30% Nalco 2360 in the slurry mix to avoid unacceptable tool vibration.

Adding $NH_4OH$ to the diluted Nalco 2360 slurry did not enhance the Ge RR significantly. As shown in FIG. 5, $NH_4OH$ concentrations below 10% with diluted slurry nor 100% $NH_4OH$ alone appreciably affected the Ge RR for the respective slurry mix. With oxide removal rates at a level to avoid vibration, a preferred selectivity of Ge faster than $SiO_2$ was not experimentally achievable for any $NH_4OH$ concentrations in the slurry mix.

Figure 6:
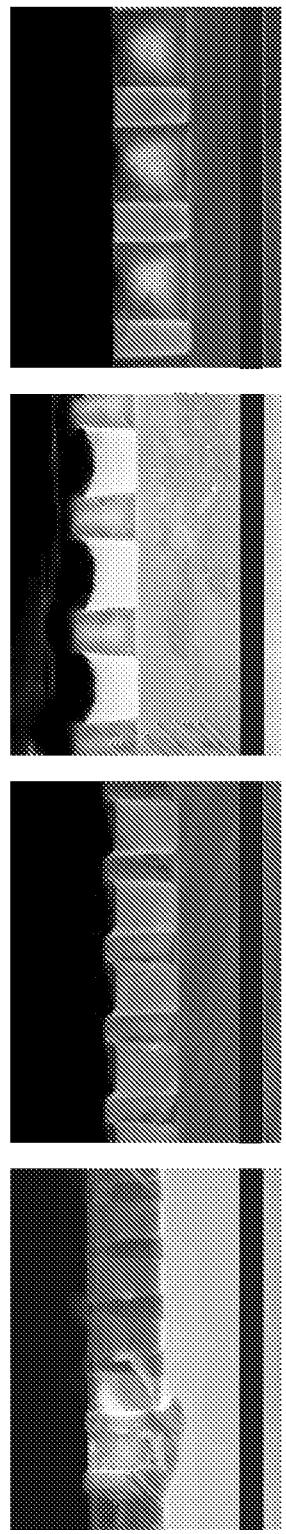
FIG. 6 illustrates cross-sectional SEM images of Ge ART sections polished with 2.8% $NH_4OH$ and 4.6% Nalco 2360 in the slurry mix (polished despite vibration).

FIG. 6 illustrates exemplary results using cross-sectional SEM images of Ge ART sections of different trench widths polished with 2.8% $NH_4OH$ and 4.6% Nalco 2360, where the Ge RR should have been higher than the oxide RR (oxide RR could not be measured at this low slurry concentration because of vibration). The sample shown in FIG. 6 was polished despite vibrations, but polishing could not regularly occur using the slurry mix because of the vibration of the CMP tool. Dishing is also apparent in FIG. 6.

Figure 7:
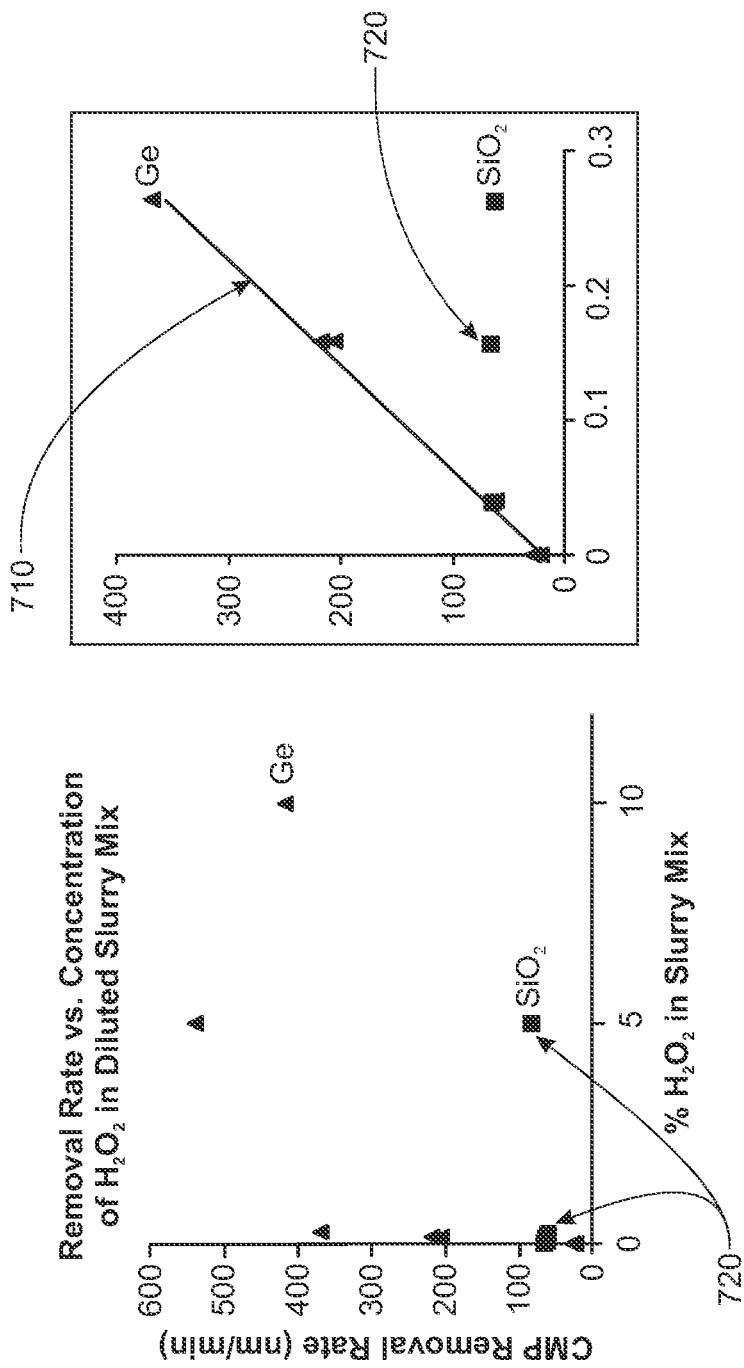
FIG. 7 illustrates Ge and $SiO_2$ removal rates determined for slurry mixes containing $H_2O_2$ additive with additional detail for a low concentration range (at right).

FIG. 7 illustrates Ge and $SiO_2$ removal rates determined for exemplary slurry mixes containing $H_2O_2$ additives. Additional detail of Ge and $SiO_2$ removal rates 710 determined for exemplary slurry mixes having a low concentration range between 0 and 0.3% $H_2O_2$ is shown to the right. As shown in FIG. 7, slurry mix with low concentrations of $H_2O_2$ (e.g., >0.05%) polishes Ge selectively to $SiO_2$ even with 35% Nalco 2360 slurry in the slurry mix to avoid vibration. Further, an oxide removal rate 720 did not vary significantly up to 5% $H_2O_2$.

Figure 8:
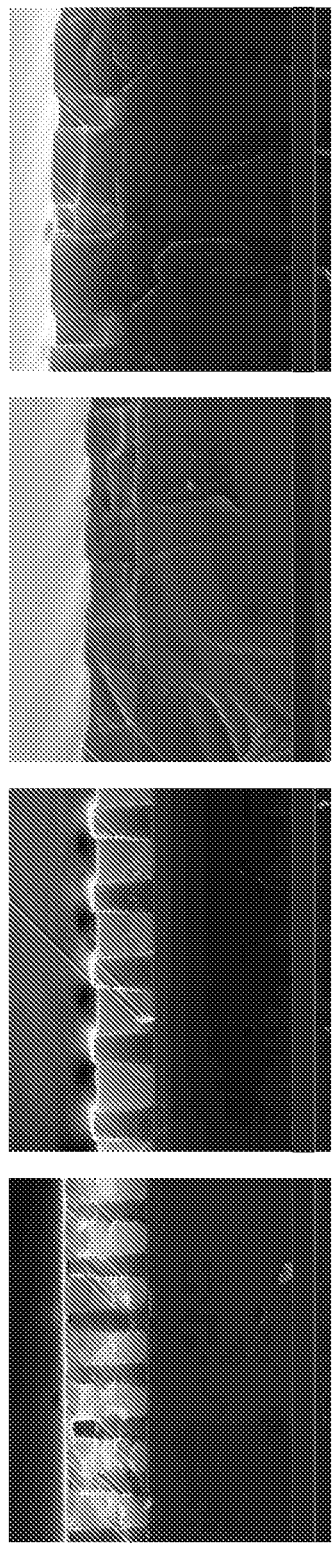
FIG. 8 illustrates cross-sectional SEM images of Ge ART sections of different composite structures polished with 0.16% $H_2O_2$ and 35% Nalco 2360 in a slurry mix.

FIG. 8 illustrates exemplary results using cross-sectional SEM images of Ge ART sections polished with 0.16% $H_2O_2$ and 35% Nalco 2360 in the slurry mix. As shown in FIG. 8, dishing and overpolish are acceptable in these pattern areas. In addition, overpolishing requirements can be controlled by endpointing to a specific pattern of interest.

Figure 9:
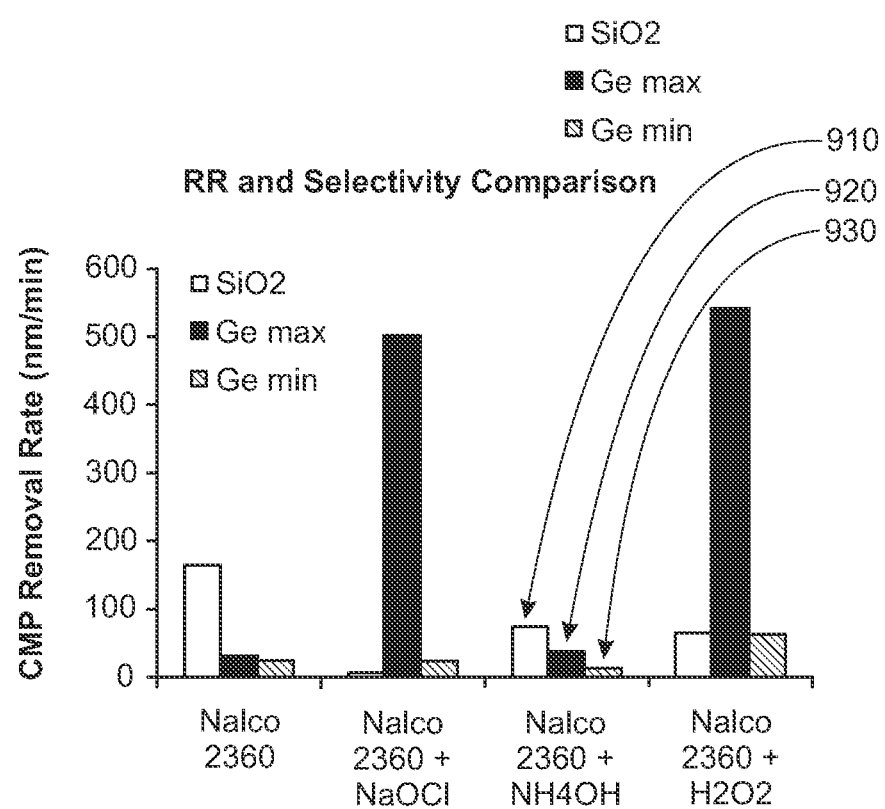
FIG. 9 illustrates comparison of Ge and oxide removal rates and selectivities for slurry mixes with different additive chemicals.

FIG. 9 illustrates a comparison of exemplary oxide and Ge removal rates and selectivity determined for slurry mixes with the different additive chemicals. The graph is intended to show comparison of removal rates and Ge/$SiO_2$ selectivity only, and therefore, slurry and additive concentrations are not the same. In FIG. 9, the data presented (left-to-right) for each slurry mix is $SiO_2$ RR 910, Ge maximum RR 920 and Ge minimum RR 930. As illustrated in FIG. 9, the addition of $H_2O_2$ to the diluted slurry provided results sufficient for device fabrication and the best results based on the selectivity and/or dishing (e.g., see SEM results described above).

Figure 10:
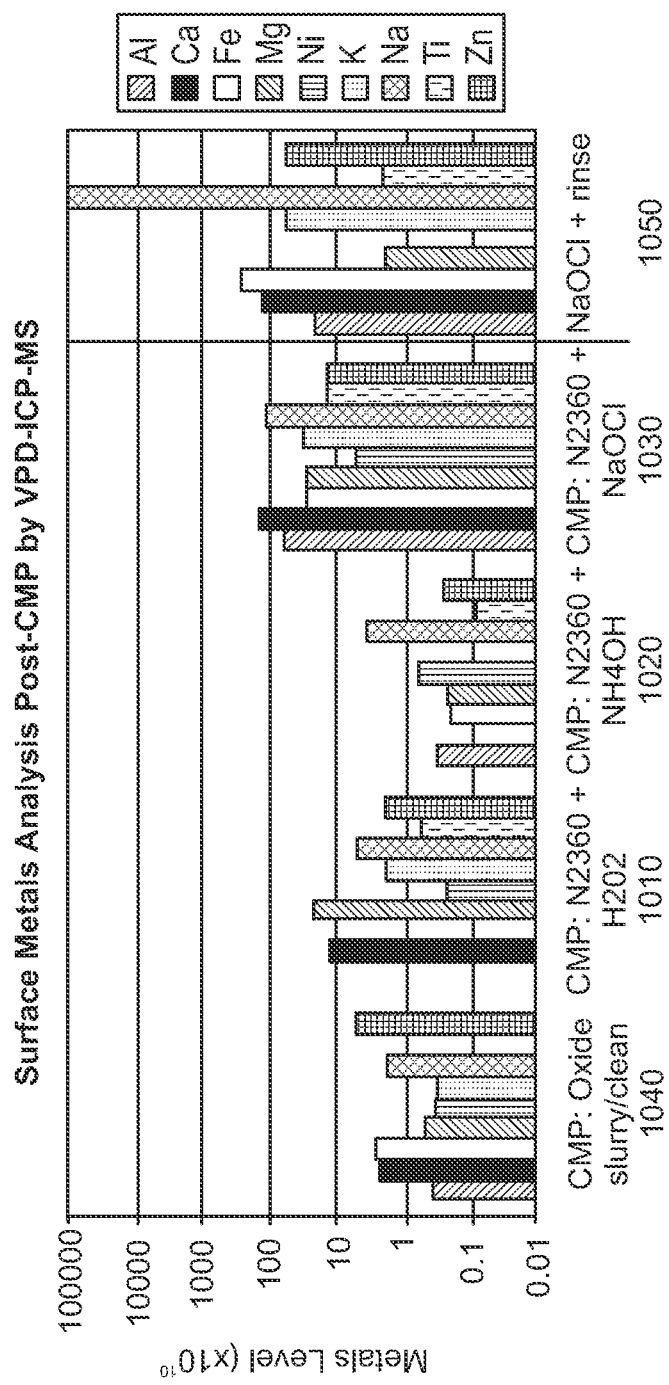
FIG. 10 illustrates concentration of selected metallic elements at the wafer surface for diluted slurry-additive combinations post-CMP, with comparative data for an oxide CMP process on the same equipment and an evaluation of NaOCl on a wafer without polishing. Data is all from the front-side of the wafer. No data shown for a given metal indicates that the level for that metal was below detection limits of the VPD-ICP-MS analysis.

In addition to removal rate and selectivity, each of the primary three diluted slurry-additive combinations was tested for concentration of selected metallic elements at the wafer surface post-CMP. Wafer surfaces post-CMP were tested for more than 25 contaminant materials and collected data 1010, 1020, 1030 is respectively shown in FIG. 10. In addition, FIG. 10 illustrates data for an oxide CMP process 1040 performed on the Strasbaugh CMP (e.g., for comparison to the $H_2O_2$ data 1010 and $NH_4OH$ data 1020) and data 1050 for a wafer exposed to NaOCl and rinsed. As shown in FIG. 10, $NH_4OH$ added to the slurry mix has the lowest metals levels of the three additives.

Further, high metals in data 1050 observed on a wafer after exposure to NaOCl show that the levels on a wafer post-CMP can be caused by contamination from the NaOCl solution. Such high levels of contaminant metals (and dishing observed when using NaOCl additive) in the slurry mix are not acceptable for post-CMP device fabrication.

As shown in FIG. 10, some metals levels (e.g., Mg) for polishing with $H_2O_2$ in the slurry mix are higher than acceptable levels for post-CMP device fabrication, but this additive had the best performance in coplanar CMP. Such acceptable levels can be generally $5 \times 10^{10}/cm^2$ or less. A cleaning step was devised to follow the megasonic post-CMP clean that included a DI water rinse and hydrofluoric acid (HF) dip. Ge may etch slightly in this cleaning step. After the water rinse and HF dip, metals levels were reduced to acceptable levels for samples polished with the $H_2O_2$-containing slurry mix.

Figure 11B:
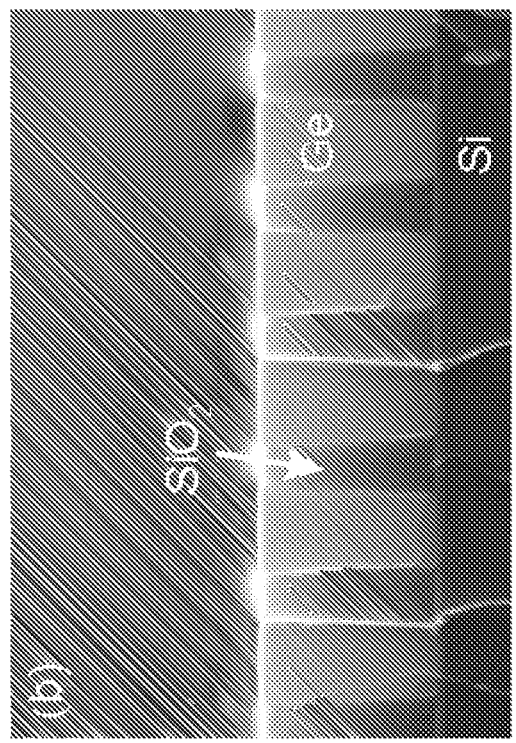
FIGS. 11(a)-11(b) illustrate cross-sectional SEM images of germanium structure before (a) and after (b) CMP with $H_2O_2$ additive in a slurry mix.
Figure 11A:
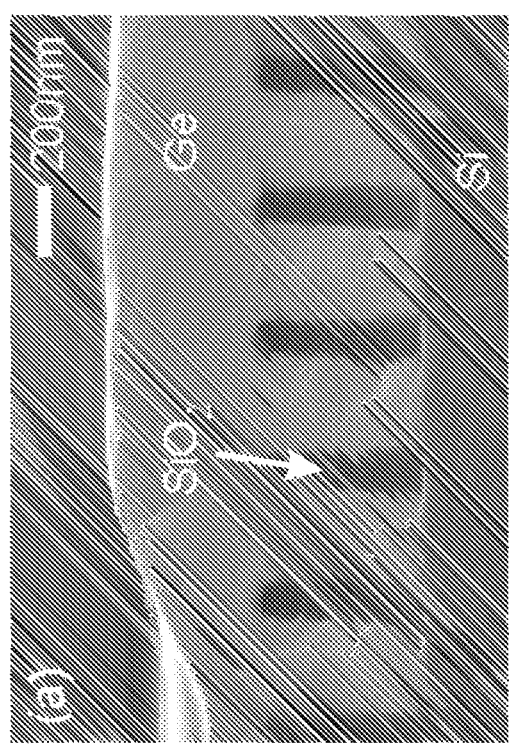

From the exemplary experimental data, $H_2O_2$ was the chemical additive to the slurry mix with superior performance in terms of removal rate and selectivity (e.g., FIGS. 7 and 9), and contaminant or metals levels post-CMP (e.g., FIG. 10). A successful CMP planarization using an embodiment of a CMP composition according to the present general inventive concept is illustrated in FIG. 11(b). FIGS. 11(a) and 11(b) illustrate respective cross-sectional SEM images of germanium structure before and after CMP with $H_2O_2$ additive (here 0.16% $H_2O_2$) in the slurry mix.

According to embodiments of the invention, sufficient planarization results in the ability to implement the planarized lattice-mismatched semiconductor material or composite crystalline/insulator structure, which may be formed using ART techniques, in a semiconductor device. In one embodiment, dishing is preferably less than 50 nm, less than 30 nm, less than 20 nm or less than 10 nm. The surface smoothness can be measured by a surface roughness Rms (root mean square). Rms of the Ge in a Ge/oxide composite structure was calculated only on the Ge area and did not include the oxide. The overall Rms value can reflect variations of Ge surface height from one trench to another, within a trench or along the length of the trenches. In one embodiment, the surface roughness (Rms) is preferably less than 20 nm, less than 10 nm less than 5 nm, less than 3 nm, or less than about 1 nm, and may be less than 0.5 nm or less than 0.2 nm. In one embodiment, overpolishing is a significant concern for reduced device dimensions corresponding to the exemplary disclosed devices. In one embodiment, overpolishing is preferably less than 50 nm, less than 10 nm, less than 5 nm or less than 2 nm. In one embodiment, the step height is less than 30 nm, less than 20 nm, less than 15 nm or less than 10 nm. As illustrated in FIG. 11(b), exemplary results of CMP according to embodiments of the invention satisfy prescribed or required coplanar characteristics of the polished surface.

In addition, for CMP of Ge ART, a Ge:$SiO_2$ polish selectivity of about 5:1 is preferred. This exemplary selectivity can reduce or prevent significant overpolish or dishing. As described above, embodiments of a slurry mix using $H_2O_2$ were able to provide the prescribed selectivity.

Once slurry mix chemistry was determined (e.g., Nalco 2360, $H_2O_2$, and DI water), process and performance improvement for embodiments of the invention were tested (e.g., on the Ge ART samples). For example, embodiments of the invention were tested to determine the effects of $H_2O_2$ concentrations on removal rates for various compositions and process considerations for characteristic CMP results (e.g., a more effective CMP process). Additional factors to consider when evaluating removal rate data for various concentrations of $H_2O_2$ additive in the slurry mix include pitting and polish time. Dishing can increase when selectivity increases. In addition, removal rates that are too low can unduly increase polish time.

Pitera disclosed pitting occurred during CMP on Si/Ge material combinations when using $H_2O_2$, but avoided the problem by adding an additional oxide layer that was then polished using known CMP techniques. FIGS. 12(a) and 12(b) confirm such results for relatively high $H_2O_2$ concentrations. FIGS. 12(a) and 12(b) illustrate pitting 1210 in plan-view SEM for a Ge blanket film sample polished with 10% $H_2O_2$ in the slurry mix and trench Ge ART samples polished with 5% $H_2O_2$ in the slurry mix, respectively.

Figure 13:
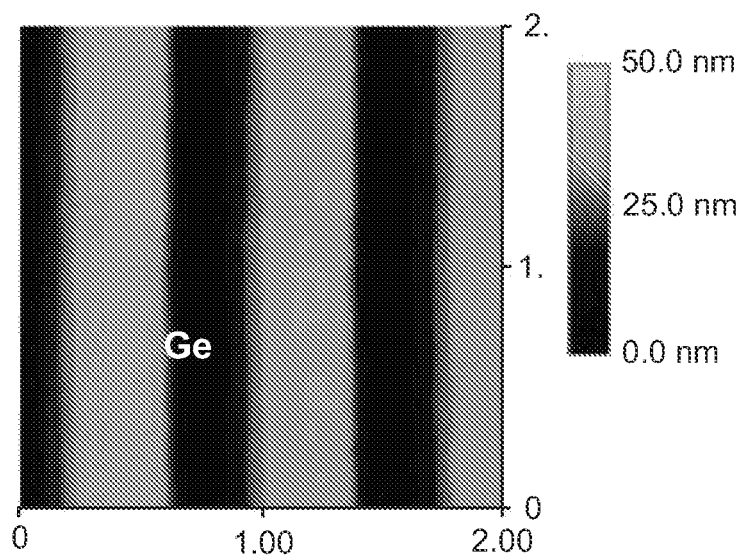
FIG. 13 shows 2 µm×2 µm AFM scan of an exemplary Ge ART sample polished with 0.16% $H_2O_2$ in the slurry mix that resulted in 30 nm of dishing and RMS roughness measured in the Ge area of 0.21 nm.

At one preferred concentration of 0.16% $H_2O_2$ in a slurry mix, pitting of the Ge surface was not detected. FIG. 13 illustrates a 2 μm×2 μm AFM scan of a Ge ART sample polished with 0.16% $H_2O_2$ in the slurry mix. In FIG. 13, dishing is 30 nm, and RMS roughness (of Ge areas in a Ge ART sample) measured by AFM is 0.21 nm. As shown in FIG. 13, decreasing concentration of $H_2O_2$ was able control or decrease pitting effects in CMP for Ge.

Figure 14A:
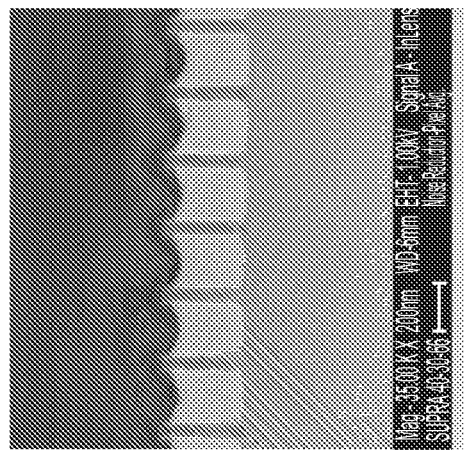
FIGS. 14(a)-14(b), illustrate (a) SEM image of significant dishing in Ge ART sample at 5% $H_2O_2$ (b) TEM image of Ge ART sample polished using one slurry mix embodiment.
Figure 14B:
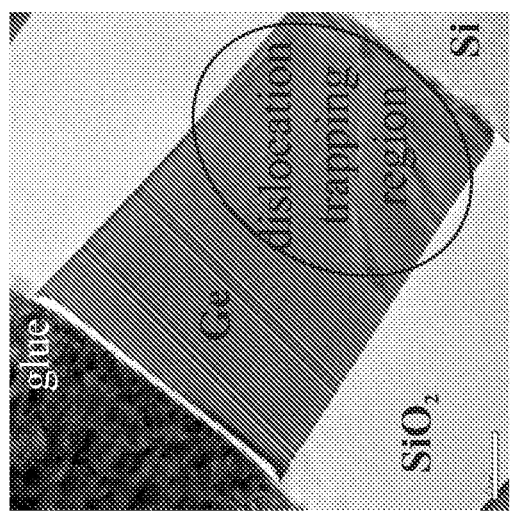

Dishing can vary with concentration of $H_2O_2$ in the slurry mix, ranging from unacceptable levels at high concentrations (e.g., over 5% $H_2O_2$ concentration) to ~20-50 nm for 200-375 nm wide Ge ART trenches at 0.16% $H_2O_2$. FIGS. 14(a) and 14(b) respectively illustrate such differences post-CMP using an SEM image of an unacceptably dished sample (5% $H_2O_2$) and a TEM image of polished Ge ART at 0.16% $H_2O_2$, respectively.

Most of the samples presented here were used a post-CMP megasonic clean (except those polished using NaOCl additive in the slurry mix, because the equipment was not available at that time). Samples that required low metals also used a water rinse and HF dip (primarily used for samples that underwent additional processing post-CMP). The megasonic cleaning used SC-1 chemistry for all oxide wafers, but SC-1 chemistry was detected to etch Ge even at low concentrations (e.g., primarily caused by the $H_2O_2$). Since etching occurred even at low concentration, DI water only was then used in the megasonic clean for all the Ge samples (e.g., blanket film and Ge ART). The DI water-only megasonic clean was effective for slurry particle removal on the Ge samples, except where sample topography (for example incomplete planarization) prevented slurry from escaping the surface.

Effect of Coalescence on CMP

All of the post-CMP Ge ART samples described above used pre-CMP structures that coalesced over the oxide trenches during growth (e.g., see FIG. 11(a)). The selective Ge growth caused each of the patterned areas to have a different thickness of coalescence over the trenches, which leads to different elapsed polish times to reach coplanar Ge ART for each patterned area. However, the lattice-mismatched semiconductor materials (e.g., Ge) do not need to coalesce over the oxide trenches if a CMP process can effectively planarize uncoalesced crystalline growth above a top surface of the oxide trench. At the tested concentration of $H_2O_2$ (e.g., 0.16% $H_2O_2$) in the slurry mix, exemplary polish time for an uncoalesced Ge ART wafer to reach coplanar is typically less than a minute. However, a CMP process does not tend to reach a steady state until after about a minute of polish. Accordingly, control of a short process for the uncoalesced Ge ART could not be guaranteed in tested samples. In this situation, it may help that the $SiO_2$ patterning slows the polish rate as the structure begins to clear.

Initial investigations of the effect of coalescence on Ge ART CMP addressed coalescence effects on the clearing behavior of the structures during CMP, so polish controllability was not evaluated. Analysis of polished samples of "thin coalesced" and uncoalesced samples focused on dishing and overpolish as a function of polish time for four different patterned regions, for example, as shown in FIG. 15.

Figure 15:
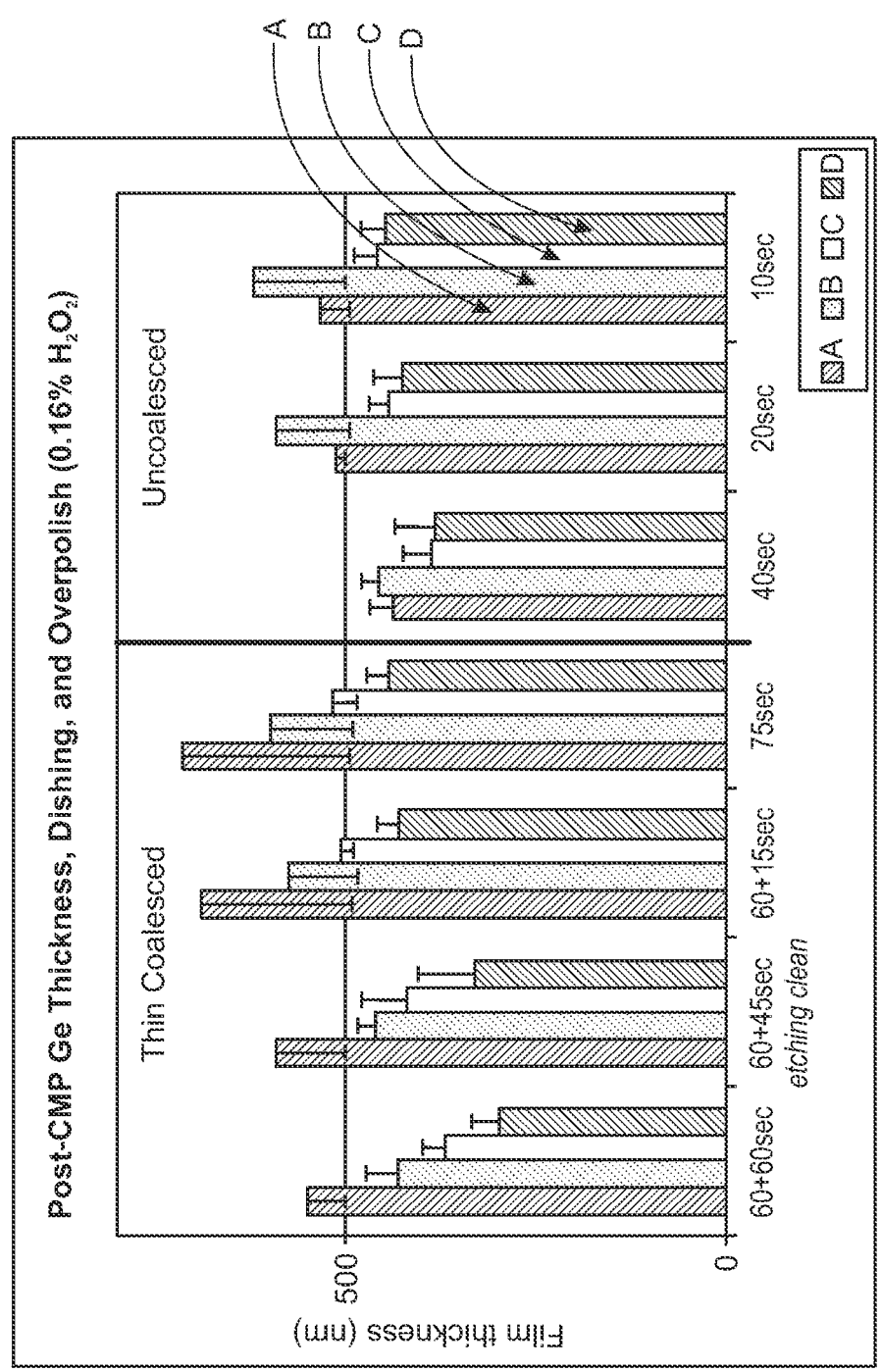
FIG. 15 illustrates Ge thickness, dishing, and overpolish for thin coalesced and uncoalesced Ge ART wafers including four different patterned areas polished in a slurry mix embodiment for different times.

Combined data for several samples is presented in FIG. 15; thin coalesced samples are on the left side of the graph, uncoalesced on the right. Times listed at the bottom of the chart reflect the polish step; where two times are listed "X+Xsec", two polishes were done on the sample. The original oxide pattern film thickness on this sample was approximately 490 nm. A 500 nm thickness reference point is illustrated in FIG. 15.

Exemplary Ge thickness, dishing, and overpolish for four different patterned areas (e.g., patterns A-D) of thin coalesced and uncoalesced Ge ART wafers polished in 0.16% $H_2O_2$-containing slurry mix for different times are shown in FIG. 15. The colored bars represent the resulting thickness of the Ge in the trenches (e.g., for a given patterned area and for a given wafer/CMP time) measured from the bottom of the oxide patterning to the bottom of any dishing that may have occurred. "Error bars" are used to show the level of the oxide post-CMP. If the error bar ends below the height of the Ge thickness bar, the Ge is under polished and some Ge remains above the patterned oxide. If the error bar ends above the height of the Ge thickness bar, the oxide height is greater than that of the Ge, and therefore the length of the error bar reflects the amount of dishing in the Ge. Finally, if the end of the error bar lies below the 500 nm horizontal line on the graph, the difference between the end of the error bar and the 500 nm line reflects how much overpolish occurred for that patterned area on that sample.

An enormous amount can be learned from the data presented in FIG. 15. First, comparing the thin coalesced vs. uncoalesced samples, it is interesting to note that the A section clears before the B section in uncoalesced, but the reverse is true for thin coalesced. Also, the amount of overpolish evident in thin coalesced sections C and D (before section A is completely cleared) is much more significant than that observed for the uncoalesced samples when all four sections are cleared. It seems that in order to more effectively clear all four sections without significant overpolish in any of the sections, polishing uncoalesced samples is better. For thin coalesced samples, after two one-minute polishes, section A is not yet cleared, while the film remaining in section D is rapidly approaching its dislocation trapping region. On the other hand, if the primary sections of interest for a given sample are C and D, the polish time for an uncoalesced sample would be extraordinarily short, and it would be better to polish from a thin coalesced sample. Only one of the samples tested here used an etching clean (e.g., low concentrations of $H_2O_2$ in the megasonic post-CMP clean), and it is clear that this sample had more significant dishing than the other samples shown. In addition, some difference can be observed between the two thin coalesced samples with similar polishing times (75 seconds in one polish and 60+15 seconds in two polishes). It seems from these two samples that the ramp-up and ramp-down steps in the CMP do polish a small amount.

Exemplary embodiments of planarized latticed mismatched material and insulator composite structures, CMP compositions and methods for using the same described above used undoped semiconductor material. However, the present general inventive concept can be applied to n-doped semiconductor materials or p-doped semiconductor materials at known concentration for devices such as those described above with similar CMP results. Further, in one embodiment a substrate can be a semiconductor polycrystalline material, semiconductor amorphous material or an insulator (e.g., glass).

Exemplary embodiments of planarized lattice-mismatched material and insulator composite structures, CMP compositions and methods for using the same described above used low removal rates. Such removal rates can be 400 nm/minute or less, 300 nm/minute or less, 200 nm/minute or less, 100 nm/minute or less to as low as 60 nm/minute.

Figure 16:
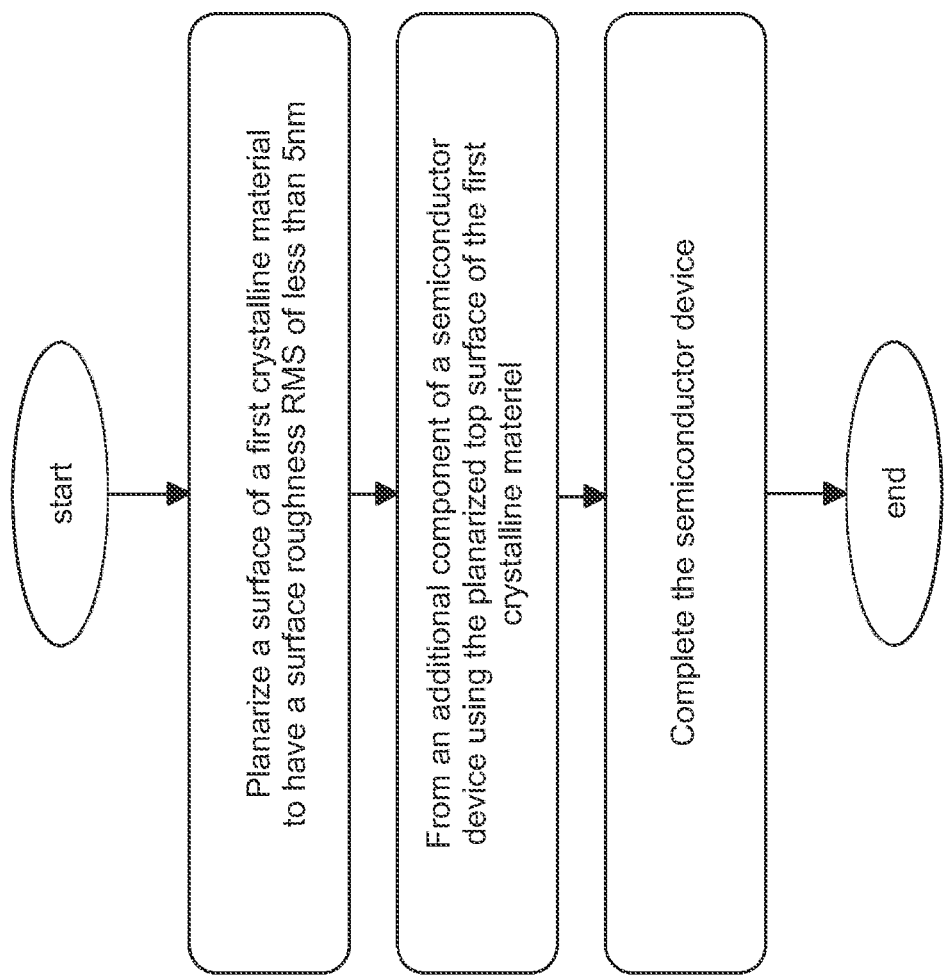
FIG. 16 is a flowchart that illustrates an embodiment of a method for making a semiconductor device having a planarized surface.

A method embodiment for making a semiconductor device having a first crystalline material confined in recess defined by an insulator will now be described with reference to FIG. 16. The first crystalline material can have a top surface above the insulator. Initially, a first crystalline material confined in recess having prescribed dimensions defined by an insulator is provided.

After a process starts, planarize a surface of the first crystalline material of a composite first crystalline material/insulator structure to have a surface roughness RMS of less than 5 nm (operation block 1610). A planarization operation can include a CMP of the composite first crystalline material/insulator structure using a slurry mix having a selectivity >1 (e.g., a selectivity of 3-5:1) of the first crystalline material: insulator in a repeatable polishing sequence that results in a coplanar planarized surface of the first crystalline material and insulator.

Form an additional component of the semiconductor device within, at, on and/or over at least the planarized top surface of the first crystalline material (operation block 1620). In one embodiment, adjacent planarized surfaces of the insulator and the first crystalline material have dishing less than 20 nm.

Complete the semiconductor device (operation block 1630).

Exemplary embodiments of, CMP compositions and methods for using the same described above can be used to polish or planarize first and second material composite structures. One exemplary composite structure can be an insulator adjacent or confining a semiconductor crystalline material, semiconductor polycrystalline material or semiconductor amorphous material. Another exemplary composite structure can be an a first semiconductor crystalline material, first semiconductor polycrystalline material or first semiconductor amorphous material adjacent or confining a second semiconductor crystalline material, second semiconductor polycrystalline material or second semiconductor amorphous material provided the selectivity of the second material is greater than the first material in accordance with example embodiments. Exemplary first and second adjacent materials can have micron or submicron dimensions. In one embodiment, the second material dimension can be of any size.

In one embodiment the first crystalline material is a lattice-mismatched semiconductor material. In another embodiment, the first crystalline material has a coalesced top surface connecting first crystalline material from a plurality of adjacent recesses. In one embodiment, the recess is a hole, trench, or a plurality of trenches each having a prescribed cross-section. In one embodiment, the insulator has an opening to a substrate of a second crystalline material lattice-mismatched to the first crystalline material. In one embodiment, the first crystalline material confined in the recess defined by the insulator was formed using ART techniques. In one embodiment, the second crystalline material may include a group IV element or compound, such as germanium and/or silicon, and the first crystalline material may include at least one of a group IV element or compound, a III-V or III-N compound, or a II-VI compound. While exemplary embodiments may be effective for various materials like a group III-V compound or group IV material like silicon, oxidation during a CMP process may vary. Thus, polishing of materials including semiconductor crystalline lattice-mismatched materials where water soluble oxidation results can enhance polishing characteristics or interactions corresponding to a CMP process.

In an embodiment, a post-CMP clean of the planarized surface can be performed. The post-CMP clean can be a megasonic clean using DI water.

As described above, embodiments of CMP process can planarize lattice-mismatched materials and lattice-mismatched material/insulator composite structures effectively. Further, embodiments can planarize first material adjacent second material combinations for use in semiconductor device applications including incorporation with CMOS techniques, processes and devices. Embodiments of devices according to the application can include planarized composite structures. Embodiments according to the application can include CMP compositions. One embodiment of a CMP process can planarize Ge in oxide trenches on Si substrates generated by Aspect Ratio Trapping techniques. An exemplary slurry mix according to one embodiment included 35% colloidal silica sub-micron particles, 0.1%-0.3% $H_2O_2$ 30% solution, and DI water slurry mix to provide a desired combination of selectivity and post-CMP coplanar surface characteristics, for example using crystalline materials confined by insulators formed using ART techniques, and low surface metal contamination. One slurry mix embodiment and a post-CMP cleaning embodiment were used to polish a variety of coalesced and uncoalesced Ge ART samples to coplanar Ge—$SiO_2$. Embodiments of CMP process according to the invention can be used in heterointegration by ART techniques. Embodiments of CMP process can be used to create planarized areas of defect-free Ge on a Si wafer and devices created thereby. Such structures can be used for high mobility, non-Si channel MOSFETs for next generation CMOS and for a wide variety of other applications.

As noted above, this invention has a wide variety of applications. While not limited to ART technology, this invention has many applications within ART technology. For example, use of this invention may be used to create strained Ge over a SiGe alloy grown in an opening within an insulator. One or both of the Ge and adjacent microstructure may be polished in accordance with the invention and/or may have a surface of reduced roughness. A wide variety of devices may incorporate aspects of the invention. While not limiting to these devices, the invention may be particularly applicable to mixed signal applications, field effect transistors, quantum tunneling devices, light emitting diodes, laser diodes, resonant tunneling diodes and photovoltaic devices, especially those using ART technology. application Ser. No. 11/857,047 filed Sep. 18, 2007 entitled "Aspect Ratio Trapping for Mixed Signal Applications"; application Ser. No. 11/861,931 filed Sep. 26, 2007 entitled "Tri-Gate Field-Effect Transistors formed by Aspect Ratio Trapping"; application Ser. No. 11/862,850 filed Sep. 27, 2007 entitled "Quantum Tunneling Devices and Circuits with Lattice-mismatched Semiconductor Structures"; application Ser. No. 11/875,381 filed Oct. 19, 2007 entitled "Light-Emitter-Based Devices with Lattice-mismatched Semiconductor Structures"; and application Ser. No. 12/100,131 filed Apr. 9, 2007 entitled "Photovoltaics on Silicon" are all hereby incorporated by reference as providing examples to which aspects of this invention may be particularly suited.

Any reference in this specification to "one embodiment," "an embodiment," "example embodiment," etc., means that a particular feature, structure, or characteristic described in connection with the embodiment can be included or combined in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc. In addition, exemplary diagrams illustrate various methods in accordance with embodiments of the present disclosure. Such exemplary method embodiments are described herein using and can be applied to corresponding apparatus embodiments, however, the method embodiments are not intended to be limited thereby.

Although few embodiments of the present invention have been illustrated and described, it would be appreciated by those skilled in the art that changes may be made in these embodiments without departing from the principles and spirit of the invention. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein. As used in this disclosure, the term "preferably" is non-exclusive and means "preferably, but not limited to." Terms in the claims should be given their broadest interpretation consistent with the general inventive concept as set forth in this description. For example, the terms "coupled" and "connect" (and derivations thereof) are used to connote both direct and indirect connections/couplings. As another example, "having" and "including", derivatives thereof and similar transitional terms or phrases are used synonymously with "comprising" (i.e., all are considered "open ended" terms)—only the phrases "consisting of" and "consisting essentially of" should be considered as "close ended". Claims are not intended to be interpreted under 112 sixth paragraph unless the phrase "means for" and an associated function appear in a claim and the claim fails to recite sufficient structure to perform such function.

What is claimed is:

1. A method comprising:
   providing a substrate comprising a first semiconductor crystalline material;
   providing an insulator having an opening to the substrate;
   forming a second semiconductor crystalline material within the opening in the insulator, the second semiconductor crystalline material being lattice-mismatched with the first semiconductor crystalline material; and
   planarizing top surfaces of the insulator and second semiconductor crystalline material to be coplanar within 20 nm.

2. The method of claim 1, wherein a surface roughness of the second semiconductor crystalline material is 20 nm or less.

3. The method of claim 1, wherein a surface roughness of the second semiconductor crystalline material is 0.5 nm or less.

4. The method of claim 1, wherein forming the second semiconductor crystalline material comprises trapping defects of the second semiconductor crystalline material arising from lattice mismatch with the first semiconductor crystalline material at sidewalls of the opening.

5. The method of claim 1, further comprising:
   etching the substrate to create a depression in the first semiconductor crystalline material; and
   forming the insulator over the substrate and conforming to the depression in the first semiconductor crystalline material to create a sidewall from an outer surface of the insulator.

6. The method of claim 1, wherein said planarizing comprises a ramp-up, polishing, ramp-down, and rinse.

7. A method comprising:
   defining an opening through an insulator to a substrate, the substrate comprising a first semiconductor crystalline material;
   forming a second semiconductor crystalline material within the opening, the second semiconductor crystalline material being lattice-mismatched with the first semiconductor crystalline material; and
   planarizing top surfaces of the insulator and second semiconductor crystalline material by using a chemical mechanical polishing using a slurry having a selectivity ratio of second semiconductor crystalline material to insulator that is greater than 1:1.

8. The method of claim 7, wherein the selectivity ratio is greater than 3:1.

9. The method of claim 7, wherein the selectivity ratio is about 5:1.

10. The method of claim 7, wherein the slurry comprises sub-micron slurry particles, a chemical additive solution, and water.

11. The method of claim 7, wherein the slurry comprises a hydrogen peroxide ($H_2O_2$) solution.

12. The method of claim 11, wherein a concentration of the hydrogen peroxide in the slurry is in a range from 0.1% to 0.3%.

13. The method of claim 7 further comprising cleaning the insulator and the second semiconductor crystalline material after the planarizing, the cleaning comprising using a hydrofluoric acid (HF) dip.

14. The method of claim 7, wherein after the planarizing, the top surface of the second semiconductor crystalline material has dishing less than 50 nm.

15. The method of claim 7, wherein after the planarizing, the top surface of the second semiconductor crystalline material has a surface roughness RMS of less than 20 nm.

16. A method comprising:
   defining an opening through an insulator to a substrate, the substrate comprising a first semiconductor crystalline material;
   forming a second semiconductor crystalline material within the opening, the second semiconductor crystalline material being lattice-mismatched with the first semiconductor crystalline material; and
   planarizing top surfaces of the insulator and second semiconductor crystalline material by using a chemical mechanical polishing using a slurry comprising a hydrogen peroxide ($H_2O_2$) solution.

17. The method of claim 16, wherein the slurry has a selectivity ratio of second semiconductor crystalline material to insulator that is greater than 1:1.

18. The method of claim 16, wherein the slurry further comprises sub-micron slurry particles and water.

19. The method of claim 16, wherein a concentration of the hydrogen peroxide in the slurry is in a range from 0.1% to 0.3%.

20. The method of claim 16, wherein after the planarizing, the top surface of the second semiconductor crystalline material has a surface roughness RMS of less than 20 nm and has dishing less than 50 nm.

* * * * *